United States Patent
Liu

(10) Patent No.: US 8,203,134 B2
(45) Date of Patent: Jun. 19, 2012

(54) MEMORY DEVICES WITH ENHANCED ISOLATION OF MEMORY CELLS, SYSTEMS INCLUDING SAME AND METHODS OF FORMING SAME

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 211 days.

(21) Appl. No.: 12/563,277

(22) Filed: Sep. 21, 2009

(65) Prior Publication Data

US 2011/0068313 A1    Mar. 24, 2011

(51) Int. Cl.
*H01L 45/00* (2006.01)
(52) U.S. Cl. ........ 257/4; 257/1; 257/64; 257/536; 257/E27.025; 257/E27.047; 257/E27.101; 365/148
(58) Field of Classification Search ........ 257/1, 2, 257/3, 4, 5, 52, 64, 65, 536, 577, E27.025, 257/E27.047, E27.101; 365/148
See application file for complete search history.

(56) References Cited

U.S. PATENT DOCUMENTS

| | | | |
|---|---|---|---|
| 6,150,253 A | 11/2000 | Doan et al. | |
| 6,294,452 B1 | 9/2001 | Doan et al. | |
| 6,746,892 B2 | 6/2004 | Lee et al. | |
| 6,815,704 B1 | 11/2004 | Chen | |
| 6,885,602 B2 | 4/2005 | Cho et al. | |
| 7,050,328 B2 | 5/2006 | Khouri et al. | |
| 7,052,997 B2 | 5/2006 | Sandhu | |
| 7,057,923 B2 | 6/2006 | Furkay et al. | |
| 7,130,214 B2 | 10/2006 | Lee | |
| 7,238,959 B2 | 7/2007 | Chen | |
| 7,449,710 B2 | 11/2008 | Lung | |
| 7,479,649 B2 | 1/2009 | Lung | |
| 7,518,007 B2 | 4/2009 | Seo et al. | |
| 7,829,876 B2 * | 11/2010 | Lung | 257/2 |
| 7,928,421 B2 * | 4/2011 | Lung | 257/3 |
| 2004/0036109 A1 | 2/2004 | Inoue et al. | |
| 2005/0145910 A1 | 7/2005 | Tamai et al. | |
| 2005/0167656 A1 | 8/2005 | Sun et al. | |
| 2006/0034116 A1 | 2/2006 | Lam et al. | |
| 2006/0152186 A1 | 7/2006 | Suh et al. | |
| 2006/0226409 A1 | 10/2006 | Burr et al. | |
| 2007/0051935 A1 | 3/2007 | Lee et al. | |
| 2007/0126040 A1 | 6/2007 | Lung | |
| 2007/0131980 A1 | 6/2007 | Lung | |

(Continued)

FOREIGN PATENT DOCUMENTS

KR    10-2004-0050515 A    6/2004

OTHER PUBLICATIONS

PCT International Search Report of the ISA/KR, International Application No. PCT/US2010/048354, Mar. 23, 2011, three (3) pages.

(Continued)

*Primary Examiner* — Evan Pert
*Assistant Examiner* — Eduardo A Rodela
(74) *Attorney, Agent, or Firm* — TraskBritt

(57) ABSTRACT

Memory cells of a memory device including a variable resistance material have a cavity between the memory cells. Electronic systems include such memory devices. Methods of forming a memory device include providing a cavity between memory cells of the memory device.

16 Claims, 11 Drawing Sheets

U.S. PATENT DOCUMENTS

| | | |
|---|---|---|
| 2007/0158862 A1 | 7/2007 | Lung |
| 2007/0181932 A1 | 8/2007 | Happ et al. |
| 2007/0246699 A1 | 10/2007 | Lung |
| 2008/0014733 A1 | 1/2008 | Liu |
| 2008/0055969 A1 | 3/2008 | Liu |
| 2008/0121862 A1 | 5/2008 | Liu |
| 2008/0149912 A1 | 6/2008 | Nakai |
| 2008/0237565 A1 | 10/2008 | Chang |
| 2008/0247226 A1 | 10/2008 | Liu et al. |
| 2009/0046498 A1 | 2/2009 | Philipp et al. |
| 2009/0098678 A1* | 4/2009 | Lung .............................. 438/54 |
| 2009/0101883 A1* | 4/2009 | Lai et al. ........................... 257/3 |
| 2009/0101884 A1 | 4/2009 | Tu |
| 2009/0104799 A1 | 4/2009 | Liu et al. |
| 2009/0127538 A1 | 5/2009 | Ryoo et al. |
| 2010/0320435 A1* | 12/2010 | Tu ..................................... 257/4 |
| 2011/0006279 A1* | 1/2011 | Chen ................................. 257/5 |

OTHER PUBLICATIONS

Written Opinion of the International Searching Authority, ISA/KR, International Application No. PCT/US2010/048354, Mar. 23, 2011, four (4) pages.

* cited by examiner

MEMORY DEVICES WITH ENHANCED ISOLATION OF MEMORY CELLS, SYSTEMS INCLUDING SAME AND METHODS OF FORMING SAME

TECHNICAL FIELD

The present invention relates to memory cell structures and methods of forming memory cell structures having enhanced isolation of the memory cells for use in non-volatile memory devices including, for example, resistance memory devices and phase change memory devices, to memory devices formed by such methods, and to systems including such memory devices.

BACKGROUND

Various types of non-volatile memory devices employ materials that can be caused to selectively exhibit more than one stable value of electrical resistivity. To form a single memory cell (i.e., one bit), a volume of such a material may be provided between two electrodes. A selected voltage (or current) may be applied between the electrodes, and the resulting electrical current (or voltage) therebetween will be at least partially a function of the particular value of the electrical resistivity exhibited by the material between the electrodes. A relatively higher electrical resistivity may be used to represent a "1" in binary code, and a relatively low electrical resistivity may be used to represent a "0" in binary code, or vice versa. By selectively causing the material between the electrodes to exhibit relatively high and low values of electrical resistivity, the memory cell can be selectively characterized as exhibiting either a 1 or a 0 value.

One particular type of such non-volatile memory devices is a phase change memory device. In a phase change memory cell, the material provided between the electrodes is capable of exhibiting at least two microstructural phases or states, each of which exhibits a different value of electrical resistivity. For example, the so-called "phase change material" may be capable of existing in a crystalline phase (i.e., the atoms of the material exhibit relative long range order) and an amorphous phase (i.e., the atoms of the material do not exhibit any or relatively little long range order). Typically, the amorphous phase is formed by heating at least a portion of the phase change material to a temperature above the melting point thereof, and then rapidly cooling the phase change material to cause the material to solidify before the atoms thereof can assume any long range order. To transform the phase change material from the amorphous phase to a crystalline phase, the phase change material is typically heated to an elevated temperature below the melting point, but above a crystallization temperature, for a time sufficient to allow the atoms of the material to assume the relatively long range order associated with the crystalline phase. For example, $Ge_2Sb_2Te_5$ (often referred to as "GST") is often used as a phase change material. This material has a melting point of about 600° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 nanoseconds to 100 nanoseconds. As the GST material quickly cools when the current is interrupted, the atoms of the GST do not have sufficient time to form an ordered crystalline state, and the amorphous phase of the GST material is formed. To form the crystalline (low resistivity) phase, at least a portion of the material may be heated to a temperature of above 400° C., which is above the crystallization temperature and near, but below, the melting point of the GST material, by applying a relatively lower current through the GST material between the electrodes for a sufficient amount of time (e.g., as little as about 30 nanoseconds) to allow the atoms of the GST material to assume the long range order associated with the crystalline phase, after which the current flowing through the material may be interrupted. The current passed through the phase change material to cause a phase change therein may be referred to as the "programming current."

Various memory devices having memory cells comprising variable resistance material, as well as methods for forming such memory devices and using such memory devices are known in the art. For example, memory cells comprising variable resistance materials and methods of forming such memory cells are disclosed in U.S. Pat. No. 6,150,253 to Doan et al., U.S. Pat. No. 6,294,452, U.S. Pat. No. 7,057,923 to Furkay et al., U.S. Pat. No. 7,518,007 to Seo et al., United States Patent Application Publication No. 2006/0034116 A1 to Lam et al., and United States Patent Application Publication No. 2006/0152186 A1 to Suh et al. Furthermore, supporting circuitry that may be used to form a memory device comprising memory cells having a variable resistance material, as well as methods of operating such memory devices, are disclosed in, for example, U.S. Pat. No. 6,885,602 to Cho et al., U.S. Pat. No. 7,050,328 to Khouri et al., and U.S. Pat. No. 7,130,214 to Lee.

BRIEF DESCRIPTION OF THE SEVERAL VIEWS OF THE DRAWINGS

While the specification concludes with claims particularly pointing out and distinctly claiming what are regarded as embodiments of the present invention, the advantages of the embodiments of this invention may be more readily ascertained from the description of embodiments of the invention when read in conjunction with the accompanying drawings, in which:

DETAILED DESCRIPTION

Figure 1:
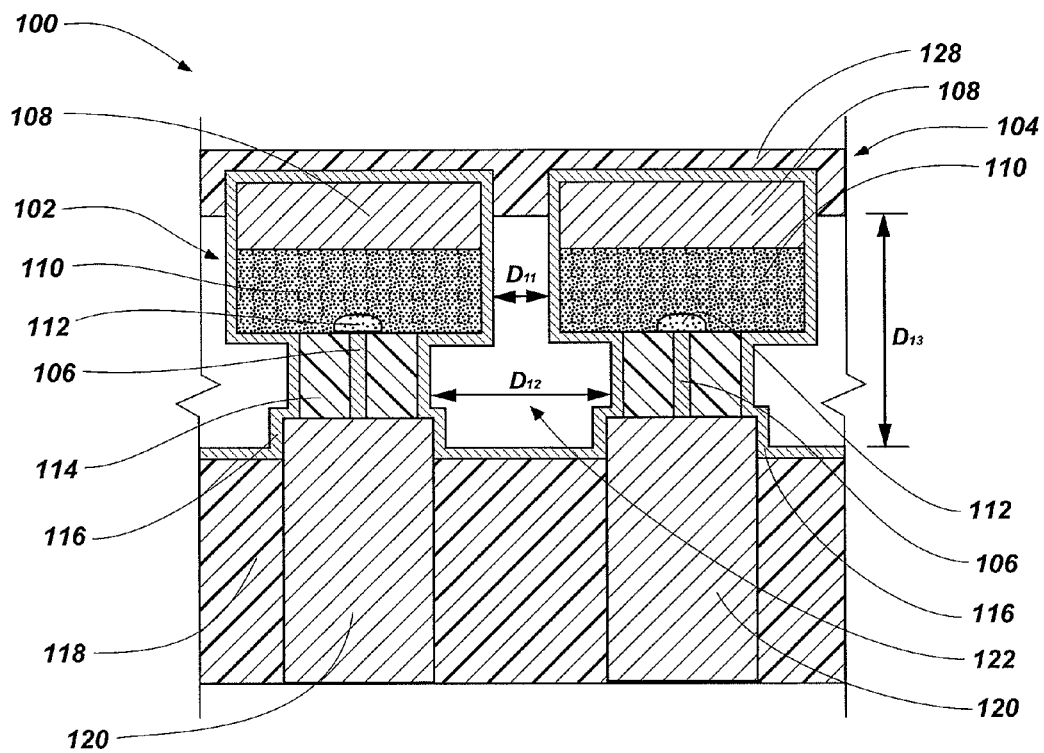
FIG. 1 is a cross-sectional schematic view of a portion of an embodiment of a memory device of the present invention illustrating two memory cells therein.

The illustrations presented herein are not meant to be actual views of any particular memory device, memory cell, workpiece, or system, but are merely idealized representations that are employed to describe embodiments of the present invention. Additionally, elements common between figures may retain the same numerical designation.

As used herein, the term "variable resistance material" means any material capable of exhibiting more than one stable value of electrical resistivity, and hence, conductivity. Variable resistance materials may include, for example, phase change materials (e.g., chalcogenides such as, for example, $Ge_2Sb_2Te_5$, $Te_{81}Ge_{15}Sb_2S_2$, and $Sb_2Te_3$), colossal magnet resistive films (e.g., $Pr_{(1-x)}Ca_xMnO_3$ (PCMO), $La_{(1-x)}Ca_xMnO_3$ (LCMO), and $Ba_{(1-x)}Sr_xTiO_3$), oxide materials (e.g., doped or undoped binary or ternary oxides such as, for example, $Al_2O_3$, $BaTiO_3$, $SrTiO_3$, $Nb_2O_5$, $SrZrO_3$, $TiO_2$, $Ta_2O_5$, NiO, $ZrO_x$, $HfO_x$, and $Cu_2O$), which may have a Perovskite structure, and materials having the general formula $A_xB_y$, where B is selected from sulfur (S), selenium (Se), and tellurium (Te), and mixtures thereof, and where A includes at least one element from Group III-B (B, Al, Ga, In, Tl), Group IV-B (C, Si, Ge, Sn, Pb), Group V-B (N, P, As, Sb, Bi), or Group VII-B (F, Cl, Br, I, At) with one or more dopants selected from noble metal and transition metal elements such as, for example, Au, Ag, Pt, Cu, Cd, In, Ru, Co, Cr, Ni, Mn, and Mo.

As used herein, the terms "distal" and "proximal" describe positions of elements of the memory device in relation to a substrate upon which the memory device is formed. For example, the term "distal" refers to a position relatively more distant from the substrate, and the term "proximal" refers to a position in closer relative proximity to the substrate.

As used herein, the term "III-V type semiconductor material" means any semiconductor material predominantly comprised of one or more elements from group IIIB of the periodic table (B, Al, Ga, In, and Tl) and one or more elements from group VB of the periodic table (N, P, As, Sb, and Bi).

As used herein, the term "II-VI type semiconductor material" means any semiconductor material predominantly comprised of one or more elements from group JIB of the periodic table (Zn, Cd, and Hg) and one or more elements from group VIB of the periodic table (O, S, Se, Te, and Po).

As used herein, the term "wafer" means any generally planar structure that includes a semiconductor material such as, for example, silicon, germanium, gallium arsenide, indium phosphide, and other III-V or II-VI type semiconductor materials. Wafers include, for example, not only conventional wafers but also other bulk semiconductor substrates such as, by way of non-limiting example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "wafer" in the following description, previous process steps may have been utilized to at least partially form elements or components of a circuit or device in or over a surface of the wafer.

FIG. 1 is a cross-sectional schematic view of a portion of an embodiment of a memory device 100 of the present invention. The memory device 100 may include an integrated circuit comprising a plurality of memory cells (e.g., a first memory cell 102 and a second memory cell 104). The memory cells 102, 104 may be arranged in an array on or in a substrate. For example, the memory cells 102, 104 may be arranged in a plurality of rows and columns. The substrate may comprise, for example, a material such as glass or sapphire, or the substrate may comprise a full or partial wafer, which may facilitate processing using conventional semiconductor fabrication processes. In some embodiments, the substrate may comprise a dielectric material 118. By way of example and not limitation, the dielectric materials discussed herein may comprise an oxide material (e.g., $SiO_2$, $Al_2O_3$, etc.), a nitride material (e.g., $Si_3N_4$, AlN, etc.), or a combination of oxide and nitride materials such as, for example, an oxynitride material, a re-oxidized oxynitride material, or a so-called "oxide-nitride-oxide" (ONO) structure. The memory cells 102, 104 may have a longitudinal axis extending from the proximal end of the memory cells 102, 104 to the distal end of the memory cells 102, 104.

As shown in FIG. 1, each of the memory cells 102, 104 may further include a first electrode 106, a second electrode 108, and a volume of variable resistance material 110 disposed between the first electrode 106 and the second electrode 108. In some embodiments, the variable resistance material 110 may comprise a phase change material. For example, the variable resistance material 110 may comprise a phase change material such as a chalcogenide material. Typical chalcogenide materials are alloys predominantly comprising tellurium (Te), germanium (Ge), and antimony (Sb) and include, for example, $Ge_2Sb_2Te_5$, $Te_{81}Ge_{15}Sb_2S_2$, and $Sb_2Te_3$. Chalcognide materials may be characterized by the general chemical formula $Te_aGe_bSb_{100-(a+b)}$, where a is less than about eighty five (85) and b is above about eight (8).

In additional embodiments, the variable resistance material 110 may comprise any of the other variable resistance materials previously mentioned herein.

In some embodiments, the electrodes 106, 108 may comprise a material such as, for example, W, Ni, tantalum nitride (TaN), Pt, tungsten nitride (WN), Au, titanium nitride (TiN), titanium aluminum nitride (TiAlN), or tantalum silicon nitride (TaSiN).

The first electrode 106 of each of the memory cells 102, 104 may be disposed over and in electrical communication with another conductive material 120. The conductive material 120 may be partially disposed in a dielectric material 118 and may communicate electrically with conductive lines, additional memory cells, etc. The conductive material 120 also may comprise a material such as, for example, W, Ni, tantalum nitride (TaN), Pt, tungsten nitride (WN), Au, titanium nitride (TiN), or titanium aluminum nitride (TiAlN) among others. The first electrode 106 may extend from the conductive material 120 to the volume of variable resistance material 110. In some embodiments, the first electrode 106 may be electrically isolated from surrounding structures by another region of dielectric material 114. In some embodiments, the first electrode 106 of each of the memory cells 102, 104 may be substantially similar to the conductive material 120 and may comprise a discrete, laterally isolated volume of conductive material such as a metal.

The second electrode 108 may be disposed over and in electrical communication with the volume of variable resistance material 110. The second electrode 108 of each memory cell 102, 104 may be substantially similar to the conductive material 120 and may comprise a discrete, laterally isolated volume of conductive material such as a metal. In some embodiments, the second electrode 108 may simply comprise an area or region of an elongated laterally extending conductive trace. In some embodiments, the second electrode 108 may comprise a discrete structure extending between two or more memory cells 102, 104. In some embodiments, the first electrodes 106 may comprise nanowires. Such memory cells including nanowires are disclosed in, for example, U.S. Patent Application Publication No. 2008/0247226 A1 to Liu et al.

As discussed below with reference to FIG. 6, in some embodiments, each second electrode 108 may communicate electrically with a conductive line (not shown) by way of electrical contacts 621, and each first electrode 106 also may communicate electrically with another conductive line (not shown) by way of the conductive material 120. In additional embodiments, the second electrode 108 of each of the memory cells 102, 104 may simply comprise a region or portion of a conductive line, and the memory cells 102, 104 need not include a separate conductive line and electrical contacts 621.

Although not shown in FIG. 1, each of the memory cells 102, 104 also may include an access transistor for selectively accessing the same for read and write operations, as known in the art.

A manner in which the memory cells 102, 104 may be used or characterized so as to represent either a "0" or a "1" in binary code is briefly described below with reference to FIG. 1. The variable resistance material 110 of the memory cells 102, 104 may exist in a first state or phase (i.e., the atoms may be disposed in a particular microstructure), which can be detected by providing a relatively low voltage between the first electrode 106 and the second electrode 108 and measuring the magnitude (e.g., amps) of the resulting current passing between the first electrode 106 and the second electrode 108 through the variable resistance material 110. By way of example and not limitation, this first state or phase (and, hence, the current magnitude) may be selected to represent a "1" in binary code.

To change the state or phase of the variable resistance material 110, a relatively high voltage may be provided between the first electrode 106 and the second electrode 108 to induce a relatively high current through the variable resistance material 110. This relatively high current flowing through the variable resistance material 110 may be referred to as the programming current and is used to heat at least a portion 112 of the volume of variable resistance material 110 to a sufficient temperature to cause a change in the state or phase of the portion 112 of the variable resistance material 110, as shown in FIG. 1. The portion 112 of the variable resistance material 110 then may exhibit an electrical resistivity (and, inversely, a conductivity) in the second state or phase that differs from the electrical resistivity in the first state or phase. As a result, the presence of the second state or phase can be detected by again providing a relatively low voltage between the first electrode 106 and the second electrode 108 and measuring the magnitude (e.g., amps) of the resulting current passing between the first electrode 106 and the second electrode 108, which will be different from the magnitude of the measured current when the portion 112 of the variable resistance material 110 is in the first state or phase. By way of example and not limitation, this second state or phase (and, hence, the second current magnitude) may be selected to represent a "0" in binary code.

The heat generated in the variable resistance material 110 as the programming current is passed therethrough by the electrodes 106, 108 is due to the electrical resistance of the variable resistance material 110. Furthermore, the amount of heat generated in the portion 112 of the variable resistance material 110 is at least partially a function of the current density in the portion 112 of the variable resistance material 110. For a given current passing through the variable resistance material 110 between the first electrode 106 and the second electrode 108, the current density in the variable resistance material 110 is at least partially a function of the size (e.g., cross-sectional area) of the smaller of the electrodes 106, 108. By using a first electrode 106 having a relatively small size, the current density in the portion 112 of the variable resistance material 110 is increased, and the programming current required to cause a phase change in the portion 112 of the variable resistance material 110 is reduced. By decreasing the required programming current, the energy required to operate the memory device 100 may be decreased. As a result, memory devices 100 having a relatively smaller first electrode may be operated using less power relative to memory devices having a relatively larger first electrode.

Referring still to FIG. 1, the memory cells 102, 104 may include yet another region of dielectric material, which is referred to herein as a passivation material 116. As used herein, the term "passivation material" means and includes any dielectric material that is used to electrically, physically or electrically and physically protect or isolate another material. Similar to the dielectric materials discussed above, the passivation material 116 may comprise, for example, an oxide material (e.g., $SiO_2$, $Al_2O_3$, etc.), a nitride material (e.g., $Si_3N_4$, AlN, etc.), or a combination of oxide and nitride materials. The passivation material 116 may be disposed over a portion of the memory cells 102, 104. For example, the passivation material 116 may be disposed over a portion of the first electrode 106, a portion of the second electrode 108, and a portion of the dielectric material 114 surrounding the volume of variable resistance material 110. As shown in FIG. 1, in some embodiments, the passivation material 116 may be substantially conformal on, and substantially surround, the exposed portions of the first electrode 106, the second electrode 108, and the dielectric material 114 surrounding the volume of variable resistance material 110. The passivation material 116 may be formed on a portion of the memory cells 102, 104 as an at least substantially conformable layer having an average thickness of between about two nanometers (2 nm) and about one thousand nanometers (1,000 nm).

In some embodiments, the passivation material 116 may electrically isolate the memory cells 102, 104 from each other and from additional surrounding memory cells. In some embodiments, the passivation material 116 may form a barrier around the memory cells 102, 104 to protect the materials of the memory cells 102, 104. For example, the passivation material 116 may be formed on the memory cells 102, 104 at relatively low temperature (e.g., 200° C.). The passivation material 116 may protect the memory cells 102, 104 by preventing the volume of variable resistance material 110 from evaporation or sublimation that may be caused by subsequent processing at relatively higher temperature (e.g., about 300° C. or more). In some embodiments, the passivation material 116 may also partially inhibit impurities (e.g., oxygen) from diffusing into the volume of variable resistance material 110 of the memory cells 102, 104.

The memory device 100 may include a cavity 122 disposed between the memory cells 102, 104. As used herein a "cavity" means an area or region substantially devoid of solid material. For example, the cavity 122 may comprise an area separating adjacent memory cells 102, 104. The cavity 122 may, for example, contain a vacuum (i.e., a vacuum cavity), a gas, a liquid, etc. As used herein, the term "vacuum" means a space within the cavity 122 that is substantially empty of matter and has a pressure of 500 torr or less. It is noted that while the embodiment of FIG. 1 illustrates a cross-sectional view of the cavity 122 extending between the first memory cell 102 and the second memory cell 102, the cavity 122, or cavities, may be disposed over multiple sides of each of the memory cells and may, in some embodiments, substantially surround the memory cells. For example, when a plurality of memory cells are arranged in a plurality of rows and columns, a cavity, or cavities, may be disposed over multiple sides of the memory cells extending around each of the memory cells, between each memory cell and the memory cells adjacent thereto.

The cavity 122 may provide enhanced isolation of the memory cell 102, 104. For example, as discussed above, in memory cells 102, 104 including a volume of variable resistance material 110, a relatively high voltage is used to change the state or phase of the variable resistance material 110. The cavity 122 may thermally insulate the variable resistance material 110 of a first memory cell 102 from heat generated in an adjacent second memory cell 104. For example, the cavity 122 disposed between adjacent memory cells 102, 104 may laterally isolate the heat generated in each of the first memory cell 102 and the second memory cell 104. In some embodiments, the cavity 122 may comprise a vacuum having a thermal conductively relatively lower than that of air or a conventional dielectric material. The relatively lower thermal conductivity of the vacuum may increase the lateral, thermal isolation of the memory cells 102, 104 by decreasing the amount of heat transferred between the memory cells 102, 104. In some embodiments, the cavity 122 may contain a fluid (e.g., a liquid or gas) having a lower thermal conductive relative to the thermal conductivity of a conventional dielectric material. The cavity may be at least substantially free of solid matter.

The cavity 122 may have a first dimension $D_{11}$ between the second electrodes 108 of the memory cells 102, 104, and between the volumes of variable resistance material 110 of the memory cells 102, 104. In some embodiments, the cavity 122 may have a second dimension $D_{12}$ greater than the first dimension $D_{11}$. For example, the cavity 122 may extend underneath the volumes of variable resistance material 110 (i.e., the cavity 122 extends along a proximal side of the volume of variable resistance material 110 toward the dielectric material 114 surrounding the first electrode 106). By extending between the dielectric material 114 surrounding the first electrode 106 of each of the memory cells 102, 104, the second dimension $D_{12}$ of the cavity 122 is greater than the first dimension $D_{11}$. The additional distance (i.e., the second dimension $D_{12}$) may provide a larger volume of the cavity 122 between the first electrodes 106 of the memory cells 102, 104. The larger volume may decrease the amount of heat transferred between the first electrodes 106 of adjacent memory cells 102, 104.

As shown in FIG. 1, in some embodiments, the cavity 122 may be partially bounded by the passivation material 116. The cavity 122 may extend between the passivation material 116 disposed over the first memory cell 102 and the passivation material 116 disposed over the second memory cell 104. Similarly, the first dimension $D_{11}$ of the cavity 122 may be defined between passivation material 116 disposed over the second electrode 108 and the volume of variable resistance material 110 of each of the memory cells 102, 104. The second dimension $D_{12}$ may extend between the passivation material 116 disposed over the dielectric material 114 surrounding the first electrode 106 of each of the memory cells 102, 104.

The memory device 100 may further include a dielectric material disposed over (e.g., on) and between distal end portions of the memory cells 102, 104. For example, a non-conformal dielectric material 128 (e.g., a non-conformal passivation material) may be disposed over each of the second electrodes 108 of the memory cells 102, 104. In some embodiments, the non-conformal dielectric material 128 may be disposed over the passivation material 116 overlying the second electrode 108 of each of the memory cells 102, 104. The non-conformal dielectric material 128 may partially bound the cavity 122 and, in some embodiments, hermetically seal the cavity 122. For example, the non-conformal dielectric material 128 may extend between the memory cells 102, 104 to form a distal boundary of the cavity 122 and to seal a vacuum within the cavity. The sealed cavity 122 may thermally insulate the memory cells 102, 104 from one another.

As discussed in further detail below, the non-conformal dielectric material 128 may be non-conformal in the sense that the material tends to have poor step coverage (e.g., the non-conformal dielectric material 128 may extend across an opening leading to the cavity 122 without substantially filling the cavity 122). For example, the non-conformal dielectric material 128 may extend along the second electrode 108 of the each of the memory cells 102, 104. The non-conformal dielectric material 128 may also extend over the cavity 122 across the gap between the second electrode 108 of the first memory cell 102 and the second electrode 108 of the second memory cell 104, which gap may have a width of, for example, 0.005 micron to 0.1 micron.

The non-conformal dielectric material 128 may be disposed over the second electrode 108 of each of the memory cells 102, 104 and extend across the cavity 122, or cavities, disposed between the memory cells 102, 104 to partially form a distal boundary of the cavity 122. For example, the passivation material 116 may form a portion of the boundary of the cavity 122 and the non-conformal dielectric material 128 may form another portion of the cavity 122. In some embodiments, the cavity 122 may be substantially enclosed. For example, the portions of the passivation material 116 and the non-conformal dielectric material 128 forming the cavity 122 may enclose the cavity 122 (i.e., the interior space of the cavity 122 may be sealed from space exterior to the cavity 122). As discussed above, in some embodiments, the sealed cavity 122 may include an interior space comprising a vacuum (i.e., the space contained within the cavity 122 is substantially empty of matter).

The cavity 122 may also have a height (e.g., dimension $D_{13}$) extending, for example, between the non-conformal dielectric material 128 and the dielectric material 118. As shown in FIG. 1, in some embodiments, the cavity 122 may extend along lateral sides (i.e., the sides lateral to the longitudinal axis of the memory cells 102, 104 extending from the proximal ends of the memory cells 102, 104 to the distal ends thereof) of each of the dielectric material 114 surrounding the first electrode 106, the second electrode 108, and the volume of variable resistance material 110 of each of the memory cells 102, 104. In some embodiments, the dimension $D_{13}$ of the cavity 122 may extend from the second electrode 108 disposed over the distal end of one of the memory cells 102, 104 toward the proximal end of the memory cells 102, 104 to the passivation material 116 disposed over the dielectric material 118 between the conductive material 120 of each memory cell 102, 104. In some embodiments, the cavity 122 may extend toward the proximal end of the memory cells 102, 104 past the distal end of the conductive material 120. For example, the cavity 122 may extend along the passivation material 116 surrounding the lateral sides of the dielectric material 114 surrounding the first electrode 106, the second electrode 108, and the volume of variable resistance material 110 of each of the memory cells 102, 104, and may extend partially along the passivation material 116 surrounding the lateral sides of the conductive material 120.

Figure 2:
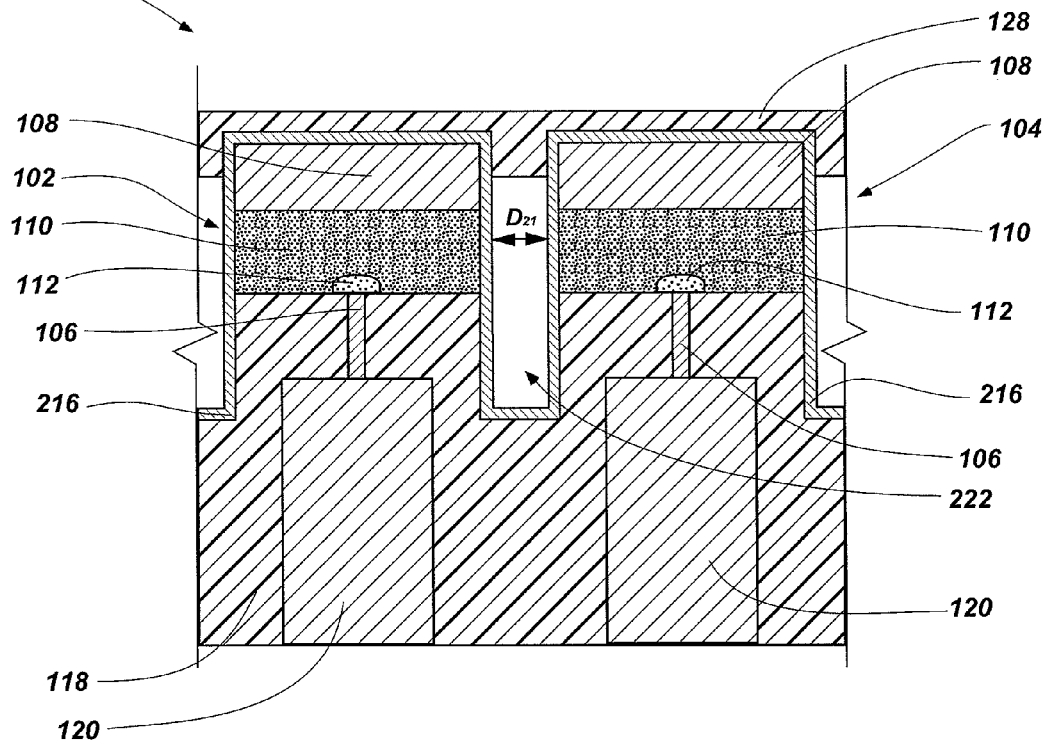
FIG. 2 is a cross-sectional schematic view of a portion of another embodiment of a memory device of the present invention illustrating two memory cells therein.

FIG. 2 is a cross-sectional schematic view of a portion of another embodiment of a memory device 200 of the present invention. The memory device 200 may be similar to the memory device 100 illustrated and described with reference to FIG. 1, and may include a first memory cell 102 and a second memory cell 104 as previously described herein.

In some embodiments, the memory device 200 may not include a separate dielectric material (e.g., the dielectric material 114 shown in FIG. 1) surrounding the first electrode 106; rather the dielectric material 118 may surround the conductive material 120 and the first electrode 106. The memory cells 102, 104 may include a passivation material 216 disposed over a portion of the memory cells 102, 104. A non-conformal dielectric material 128 may be disposed over the passivation material 216 extending around the second electrode 108 and may extend from the second electrode 108 of the first memory cell 102 to the second electrode 108 of the second memory cell 104.

The memory device 200 may include a cavity 222 disposed between the memory cells 102, 104. Portions of the passivation material 216 and non-conformal dielectric material 128 may form a boundary of the cavity 222 disposed between the memory cells 102, 104. The passivation material 216 may extend along the dielectric material 118 surrounding the first electrode 106, the second electrode 108, and the volume of variable resistance material 110. As shown in FIG. 2, in some embodiments, the cavity 222 may have a dimension $D_{21}$ extending between the memory cells 102, 104. In some embodiments, the dimension $D_{21}$ may be substantially constant between the memory cells 102, 104 and along an axis parallel to the longitudinal axis of the memory cells 102, 104. The cavity 222 may extend from the passivation material 216 disposed over the dielectric material 118 surrounding the first electrode 106, the second electrode 108, and the volume of variable resistance material 110 of the first memory cell 102 to the passivation material 216 disposed over the dielectric material 118 surrounding the first electrode 106, the second electrode 108, and the volume of variable resistance material 110 of the second memory cell 104. In some embodiments, the cavity 222 may extend from the second electrode 108 of each of the memory cells 102, 104 toward the proximal end of the memory cells 102, 104 to the dielectric material 118 proximate the conductive material 120.

Similar to the cavity 122 described above with reference to FIG. 1, the cavity 222 may be substantially enclosed and may, in some embodiments, include an interior space comprising a vacuum.

Figure 3:
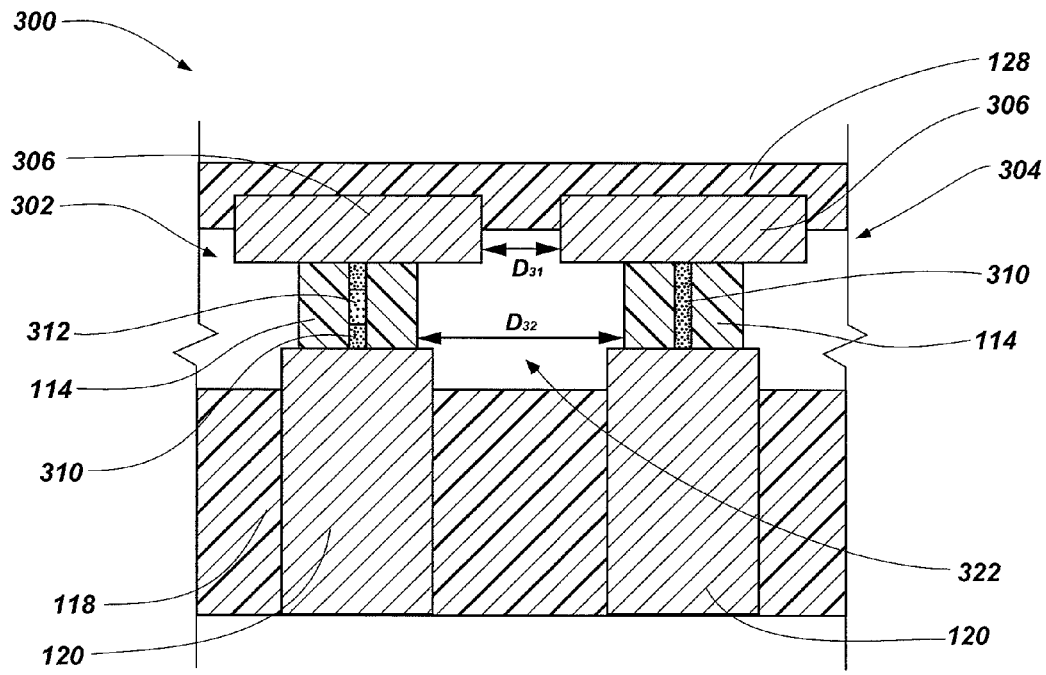
FIG. 3 is a cross-sectional schematic view of a portion of yet another embodiment of a memory device of the present invention illustrating two memory cells therein.

FIG. 3 is a cross-sectional schematic view of yet another embodiment of a memory device 300 of the present invention. The memory device 300 may be similar to the memory devices 100 and 200 illustrated and described with reference to FIGS. 1 and 2, respectively, and may include a first memory cell 302 and a second memory cell 304. The memory cells 302, 304 may be disposed over and in electrical communication with a conductive material 120 disposed over or in a dielectric material 118. The memory cells 302, 304 may include an electrode 306 and a volume of variable resistance material 310. The volume of variable resistance material 310 may extend from the conductive material 120 to the electrode 306. The volume of variable resistance material 310 may be surrounded by a volume of dielectric material 114. The electrode 306 may be disposed partially on and in electrical communication with the volume of variable resistance material 310. To change the state or phase of a portion 312 of the variable resistance material 310, a relatively high voltage may be provided between the electrode 306 and the conductive material 120 to induce a relatively high current through the variable resistance material 310.

In some embodiments, the conductive material 120 and the volume of variable resistance material 310 may comprise an intersecting configuration. For example, the conductive material 120 may extend in a first direction and the volume of variable resistance material 310 may extend in a second direction substantially perpendicular to the first direction. The conductive material 120 and the volume of variable resistance material 310 may form an electrical contact at an intersection point of the two materials. Examples of such memory cells are disclosed in, for example, U.S. Patent Application Publication No. 2008/0014733 A1 to Liu.

The memory device 300 may include a non-conformal dielectric material 128 disposed over the electrode 306 of each of the memory cells 302, 304. The non-conformal dielectric material 128 may extend from the electrode 306 of the first memory cell 302 to the electrode 306 of the second memory cell 304.

The memory device 300 may further include a cavity 322 disposed between the memory cells 302, 304. The electrode 306 of each of the memory cells 302, 304, the dielectric material 114 surrounding the volume of variable resistance material 310, the dielectric material 118, the non-conformal dielectric material 128 and, in some embodiments, the conductive material 120 may bound the cavity 322 between the memory cells 302, 304. As shown in FIG. 3, the cavity 322 may be similar to the cavity 122 shown in FIG. 1. The cavity 322 may have a first dimension $D_{31}$ extending between the electrode 306 and the volume of variable resistance material 310 of each of the memory cells 302, 304. In some embodiments, the cavity 322 may have a second dimension $D_{32}$ greater than the first dimension $D_{31}$. For example, the cavity 322 may extend along a proximal side of the volume of variable resistance material 310 toward the dielectric material 114 surrounding the volume of variable resistance material 310. In some embodiments, the cavity 322 may extend between the conductive material 120 of each of the memory cells 302, 304. In some embodiments, the cavity 322 may extend from the electrode 306 disposed over the distal end of one of the memory cells 302, 304 toward the proximal end of the memory cells 302, 304 to the conductive material 120 and the dielectric material 118 extending between the conductive material 120 of each of the memory cells 302, 304.

In some embodiments, the cavity 322 may be substantially enclosed. For example, the portions of the electrode 306, the dielectric material 114 surrounding the volume of variable resistance material 310, the dielectric material 118, the non-conformal dielectric material 128 and, in some embodiments, the conductive material 120 forming the cavity 322 may enclose the cavity 322. In some embodiments, the sealed cavity 322 may include an interior space comprising a vacuum.

Figure 4:
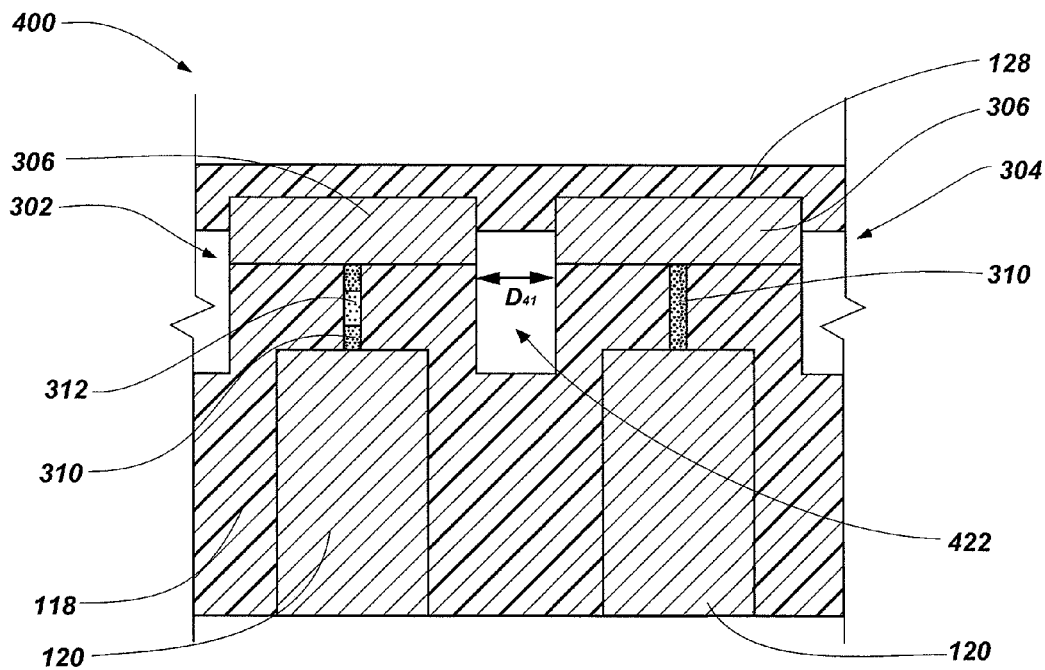
FIG. 4 is a cross-sectional schematic view of a portion of yet another embodiment of a memory device of the present invention illustrating two memory cells therein.

FIG. 4 is a cross-sectional schematic view of yet another embodiment of a memory device 400 of the present invention. The memory device 400 may be similar to the memory devices 100, 200, and 300 illustrated and described with reference to FIGS. 1, 2, and 3, respectively, and may include a first memory cell 302 and a second memory cell 304 as previously described herein.

The memory device 400 may further include a cavity 422 disposed between the memory cells 302, 304. The electrode 306 of each of the memory cells 302, 304, the non-conformal dielectric material 128, and the dielectric material 118 may form a boundary of the cavity 422 disposed between the memory cells 302, 304. As shown in FIG. 4, in some embodiments, the cavity 422 may have a dimension $D_{41}$ extending between the memory cells 302, 304. In some embodiments, the dimension $D_{41}$ may be substantially constant between the memory cells 302, 304 and along an axis parallel to the longitudinal axis of the memory cells 302, 304. In some embodiments, the cavity 422 may extend from the dielectric material 118 surrounding the volume of variable resistance material 310 of the first memory cell 302 to the dielectric material 118 surrounding the volume of variable resistance material 310 of the second memory cell 304. In some embodiments, the cavity 422 may extend between the dielectric material 118 surrounding the conductive material 120 of each of the memory cells 302, 304. In some embodiments, the cavity 422 may extend from the electrode 306 disposed over the distal end of each of the memory cells 302, 304 toward the proximal end of the memory cells 302, 304 to the dielectric material 118 proximate the conductive material 120.

Similar to the cavity 322 described above with reference to FIG. 3, the cavity 422 may be substantially enclosed and may, in some embodiments, include an interior space comprising a vacuum.

Figure 5A:
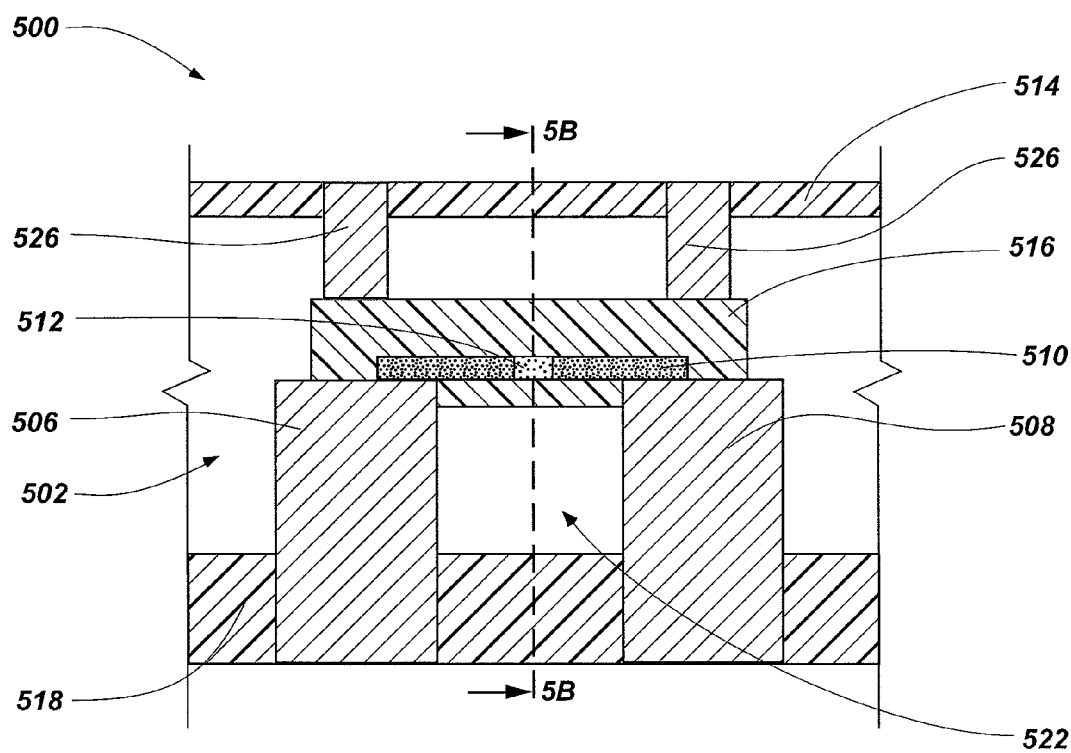
FIG. 5A is a cross-sectional schematic view of a portion of yet another embodiment of a memory device of the present invention.
Figure 5B:
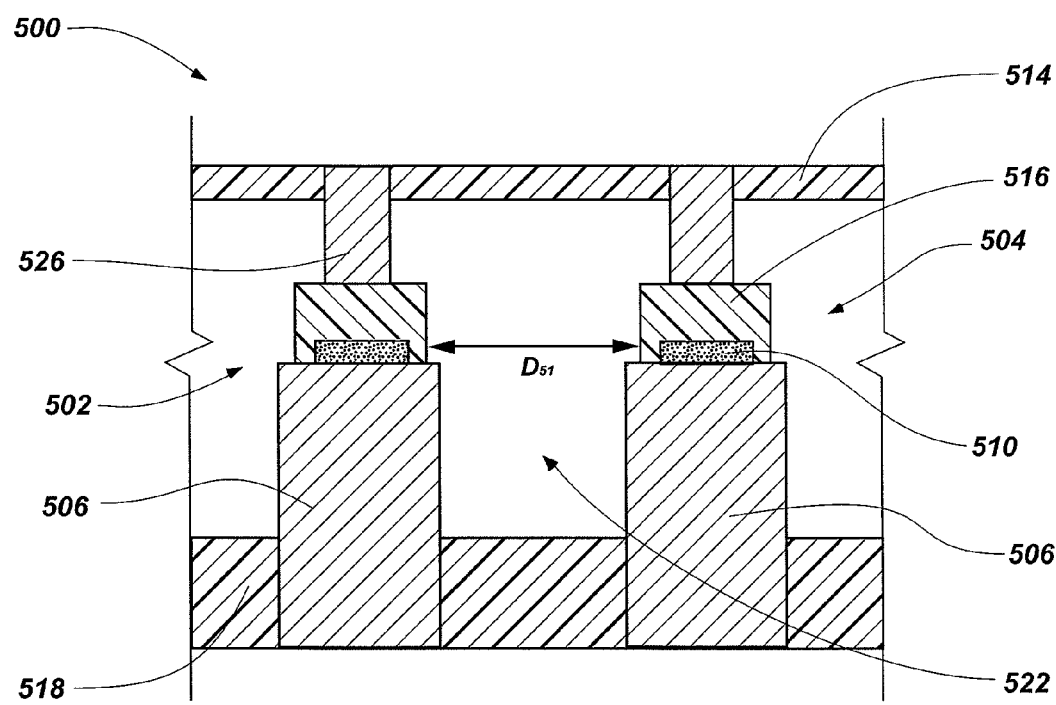
FIG. 5B is a cross-sectional schematic view of the portion of the memory device shown in FIG. 5A taken along section line 5B-5B therein.

FIG. 5A is a cross-sectional schematic view of yet another embodiment of a memory device 500 and FIG. 5B is a cross-sectional schematic view of the memory device 500 in FIG. 5A taken along section line 5B-5B. Referring to FIGS. 5A and 5B, the memory device 500 may be similar to the memory devices 100, 200, 300, and 400 illustrated and described with reference to FIGS. 1, 2, 3, and 4, respectively, and may include a first memory cell 502 and a second memory cell 504. Each of the memory cells 502, 504 may include a first electrode 506 and a second electrode 508. The electrodes 506, 508 may comprise a conductive material disposed over or in a dielectric material 518. A volume of variable resistance material 510 may extend from the first electrode 506 to the second electrode 508. The first electrode 506 and the second electrode 508 may be disposed over a common side of the variable resistance material 510, such as a side of the variable resistance material 510 proximate the dielectric material 518. The volume of variable resistance material 510 may be surrounded by a dielectric material 516. To change the state or phase of a portion 512 of the variable resistance material 510, a relatively high voltage may be provided between the first electrode 506 and the second electrode 508 to induce a relatively high current through the variable resistance material 510.

Conductive material 526 may be disposed over the dielectric material 516 of the memory cells 502, 504. For example, structures formed by the conductive material 526 may be disposed over the dielectric material 516 at two or more discrete locations proximate to each of the electrodes 506, 508. A dielectric material 514 may also be disposed over and may be supported by the conductive material 526. The dielectric material 514 may extend between the conductive material 526 disposed proximate to each of electrodes 506, 508.

The memory device 500 may include a cavity 522 disposed between the memory cells 502, 504 and, in some embodiments, between the electrodes 506, 508 of each of the memory cells 502, 504. The electrodes 506, 508, the dielectric material 516, and the conductive material 526 may form a portion of the boundary of a cavity 522. As shown in FIG. 5B, the cavity 522 may extend between each of the memory cells 502, 504 and between the dielectric material 514 and the dielectric material 518. The cavity 522 may have a dimension $D_{51}$ extending between the first memory cell 502 and the second memory cell 504. For example, the cavity 522 may extend from the dielectric material 516 surrounding the volume of variable resistance material 510 of the first memory cell 502 to the dielectric material 516 surrounding the volume of variable resistance material 510 of the second memory cell 504. In some embodiments, the cavity 522 may extend from the dielectric material 514 to the dielectric material 518. For example, the cavity 522 may extend along the lateral sides of the conductive material 526, the dielectric material 516 surrounding the volume of variable resistance material 510, and the electrodes 506, 508. In some embodiments, the cavity 522 may be formed around the entirety of the dielectric material 516 surrounding the volume of variable resistance material 510 that is not in contact with the conductive material 526 and the electrodes 506, 508.

In some embodiments, the cavity 522 may be substantially enclosed. For example, the sealed cavity 522 may include an interior space comprising a vacuum.

Figure 6:
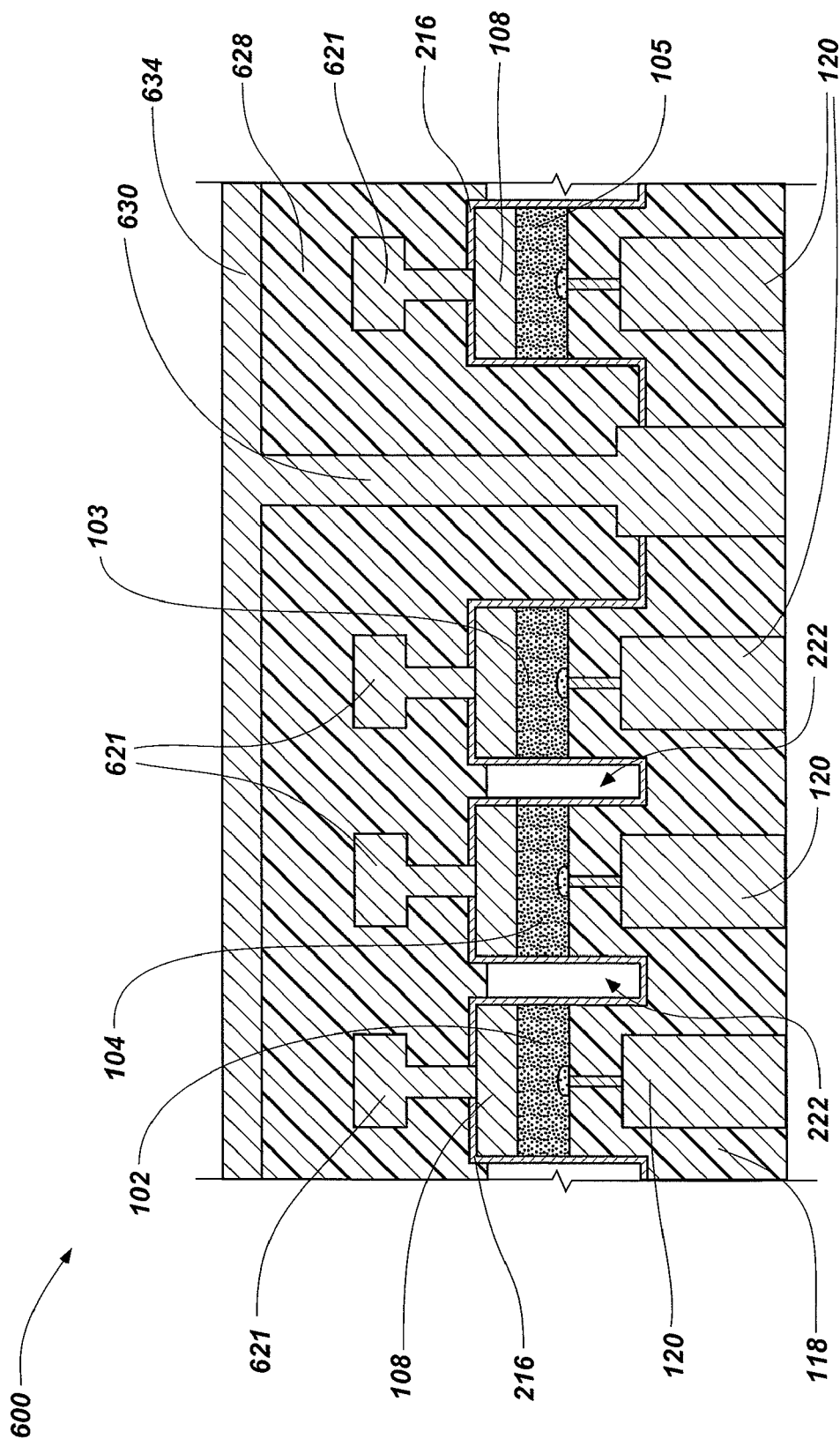
FIG. 6 is a cross-sectional schematic view of an embodiment of a memory device of the present invention illustrating four memory cells therein including a tie-down contact formation.

FIG. 6 is a cross-sectional schematic view of an embodiment of a memory device of the present invention illustrating memory cells therein including a conductive tie-down contact formation. As shown in FIG. 6, memory cells similar to the memory cells 102, 104, 302, 304, 502, and 504 shown in FIGS. 1, 2, 3, 4, 5A, respectively, may form a memory device 600 including a tie-down 630. The tie-down 630 may extend through the memory device 600 from the substrate (e.g., the dielectric material 118) to a surface of the memory device 600 opposing the dielectric material 118 (e.g., the conductive material 634). By the way of example and not limitation, the memory cells 102, 103, 104, and 105 may be similar to those described with reference to FIG. 2. The memory cells 102, 103, 104, and 105 may also include an electrical contact 621 disposed over each of the memory cells 102, 103, 104, and 105. For example, the electrical contact 621 may be disposed over and in electrical communication with the second electrode 108 of each of the memory cells 102, 103, 104, and 105. In some embodiments, the electrical contact may include a conductive line and a contact disposed over and in electrical communication with the second electrode 108 of each of the memory cells 102, 103, 104, and 105. Each second electrode 108 may communicate electrically with conductive lines, additional memory cells, etc., by way of electrical contacts 621. The tie-down 630 may extend through the dielectric 118 similar to the conductive material 120 and may also communicate electrically with conductive lines, additional memory cells, etc.

An additional dielectric material 628 may be formed on the passivation material 216 overlying the second electrode 108 of each of the memory cells 102, 103, 104, and 105. For example, the additional dielectric material 628 may include a non-conformal dielectric material. As shown in FIG. 6, the additional dielectric material 628 may be disposed over the passivation material 216 and may fill the area surrounding the tie-down 630 while not filling in the cavities 222 disposed between the memory cells 102, 103, 104, and 105. In some embodiments, the additional dielectric material 628 may also include a conformal dielectric material portion disposed over the non-conformal dielectric material portion of the additional dielectric material 628 to fill the area surrounding the tie-down 630.

Various methods for forming embodiments of memory devices according to the present invention, such as the memory devices 100, 200, 300, 400, 500, and 600 shown in FIGS. 1, 2, 3, 4, 5A, 6, respectively, are described below. To facilitate description, the methods are described with reference to a single or two memory cells (e.g., memory cells 102 and 104). In practice, however, a plurality of memory cells may be formed substantially simultaneously, and the memory cells may comprise memory cells of one or of a plurality of memory devices.

In each of the embodiments discussed below, the materials forming the memory device may be formed, grown, or otherwise provided thereon. The various materials may be formed using, for example, deposition techniques (e.g., chemical vapor deposition (CVD), physical vapor deposition (PVD), atomic layer deposition (ALD), sputtering, thermal evaporation, or plating) and patterning techniques (e.g., masking and etching) known in the art of integrated circuit fabrication. The dielectric materials comprise an oxide or silicon nitride, and may be formed by chemical vapor deposition, by decomposing tetraethyl orthosilicate (TEOS), or by any other process known in the art of integrated circuit fabrication.

Additionally, the materials or portions thereof may be removed using, for example, a chemical-mechanical polishing (CMP) process, an etching process, a lift-off process, or a combination thereof. Etching processes may include, for example, removing portions of the material using a mask and an anisotropic reactive ion (i.e., plasma) etching process and removing the material using a mask and an isotropic wet chemical etching process. It is noted that the particular composition of the gases used to generate the reactive ions, the particular composition of the chemical etchant, and the operating parameters of the etching process may be selected based on the composition of the mask, the material to be etched, and the surrounding materials.

Figure 7A:
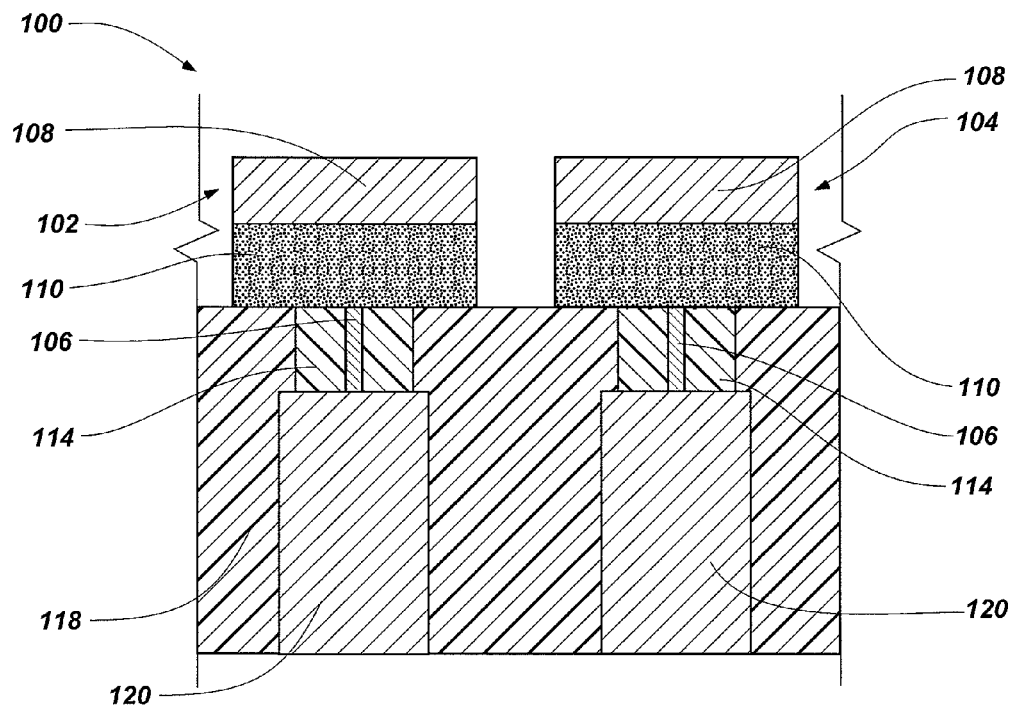
FIGS. 7A and 7B are cross-sectional side views of a workpiece and illustrate an embodiment of a method of the present invention that may be used to form a memory device like that shown in FIG. 1.

An embodiment of a method that may be used to form, for example, the memory device 100 shown in FIG. 1 is described with reference to FIGS. 7A and 7B. Referring to FIG. 7A, memory cells 102, 104 may be formed on and in electrical communication with a conductive material 120 formed on or in a dielectric material 118. The memory cells 102, 104 may include a first electrode 106, a second electrode 108, and a volume of variable resistance material 110 disposed between the first electrode 106 and the second electrode 108. The first electrode 106 may be formed on and extend from the conductive material 120 to the volume of variable resistance material 110. A dielectric material 114 may be formed on the conductive material 120 and may surround the first electrode 106. An additional dielectric material 118 (e.g., an oxide material) may surround the dielectric material 114 and the conductive material 120. The volume of variable resistance material 110 may be formed on the first electrode 106 and the dielectric material 114 surrounding the first electrode 106. The second electrode 108 may be formed on and in electrical communication with the volume of variable resistance material 110.

As shown in FIG. 7A, a portion of the second electrode 108 and the volume of variable resistance material 110 may be removed. For example, a portion of the second electrode 108 and the volume of variable resistance material 110 may be removed to form a line stripe structure (i.e., the second electrode 108 and the volume of variable resistance material 110 may extend between two or more memory cells 102, 104). Alternatively, a portion of the second electrode 108 and the volume of variable resistance material 110 may be removed to form a mesa structure (i.e., portions of the second electrode 108 and the volume of variable resistance material 110 are removed to form a discrete structure on each of the memory cells 102, 104). The portion of the second electrode 108 and the volume of variable resistance material 110 may be removed by processes such as, for example, photolithography patterning and etching. By way of example and not limitation, the portions may be formed by patterning a mask to form an aperture therein at the location at which it is desired to remove the portions of the second electrode 108 and the volume of variable resistance material 110. The second electrode 108 and the volume of variable resistance material 110 may be etched through the aperture in the mask using, for example, an anisotropic reactive ion etching process, to expose the underlying dielectric material 118.

Figure 7B:
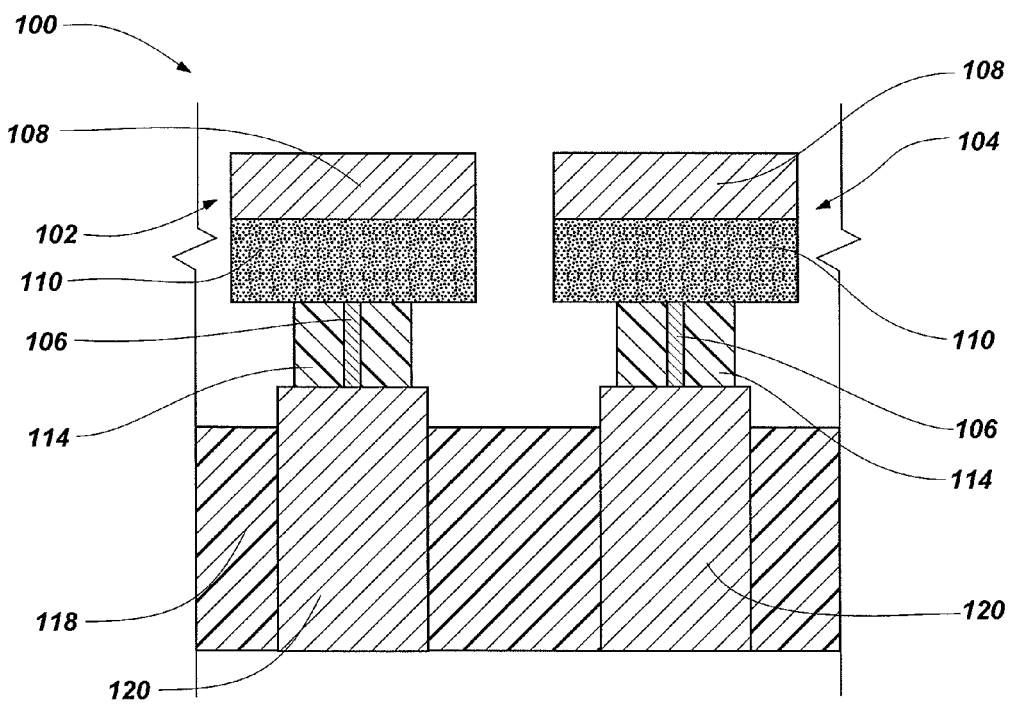

As shown in FIG. 7B, a portion of the dielectric material 118 may also be removed using a mask and etch process to form the cavity 122. By way of example and not limitation, an isotropic wet chemical etching process may be used to remove a portion of the dielectric material 118. In some embodiments, the dielectric material 118 may comprise an oxide material (e.g., $SiO_2$) and the dielectric material 114 may comprise a nitride material (e.g., $Si_3N_4$). As shown in FIG. 7B, an etchant with selectivity to the oxide material (i.e., an etchant with a particular composition configured to remove the oxide material at a faster rate as compared to the removal rate of other materials) may be used to remove the oxide and to expose the dielectric material 114 and, in some embodiments, a portion of the conductive material 120. For example, the etchant may be left on for approximately eight minutes to etch approximately 80 nanometers of the oxide material in a direction proximal end of the memory cells 102, 104. In additional embodiments, the cavity 122 may be formed using a single isotropic wet chemical etching process instead of a separate anisotropic reactive ion etching process followed by an isotropic wet chemical etching process. In some embodiments, the dielectric material 118 may be etched such that the cavity 122 extends from the distal end of the second electrode 108 of each of the memory cells 102, 104 to the distal end of the conductive material 120.

Referring back to FIG. 1, after etching the dielectric material 118, a passivation material 116 may be formed on (e.g., by a CVD or ALD process) the exposed portions of the first electrode 106, the second electrode 108, and the dielectric material 114 surrounding the volume of variable resistance material 110. A non-conformal dielectric material 128 (e.g., an oxide material) may be formed on (e.g., by a CVD or PVD process) and extend between the passivation material 116 overlying the second electrodes 108 of the memory cells 102, 104. As discussed above, the non-conformal dielectric material 128 may be non-conformal as the material tends to have poor step coverage (e.g., the material will tend to be formed in a linear or planar manner and not to deposit or fill depressions or cavities). As appreciated by those skilled in the art, "step coverage" is defined as a ratio of field coverage to sidewall coverage in the context of deposition over a gap such as a via or cavity. For example, as the non-conformal dielectric material 128 is formed on the second electrodes 108 of the memory cells 102, 104, the non-conformal dielectric material 128 may extend across a portion of the cavity 122 from the second electrode 108 of the first memory cell 102 to the second electrode 108 of the second memory cell 104. Stated in other words, the non-conformal dielectric material 128 will extend over a portion of the cavity 122 in the gap between the second electrode 108 of the first memory cell 102 and the second electrode 108 of the second memory cell 104 and will tend not to fill the cavity 122. It is noted that while the embodiment shown and described with reference to FIG. 1 illustrates forming the non-conformal dielectric material 128 over the cavity 122 formed between two memory cells 102, 104, the non-conformal dielectric material 128 may be formed over an array of memory cells covering the cavity 122 or a plurality of cavities formed throughout the memory cell array.

The non-conformal dielectric material 128 may seal the cavity 122 and may, in some embodiments, form a vacuum within the cavity 122. For example, the memory cell 100 may be formed in a substantial vacuum environment. In some embodiments, the non-conformal dielectric material 128 may be formed on the memory cells 102, 104 at a relatively low pressure (e.g., below 100 millitorr). The non-conformal dielectric material 128 may seal the cavity 122 and the vacuum space contained in the cavity 122, thereby, forming a vacuum within the cavity 122.

Figure 8A:
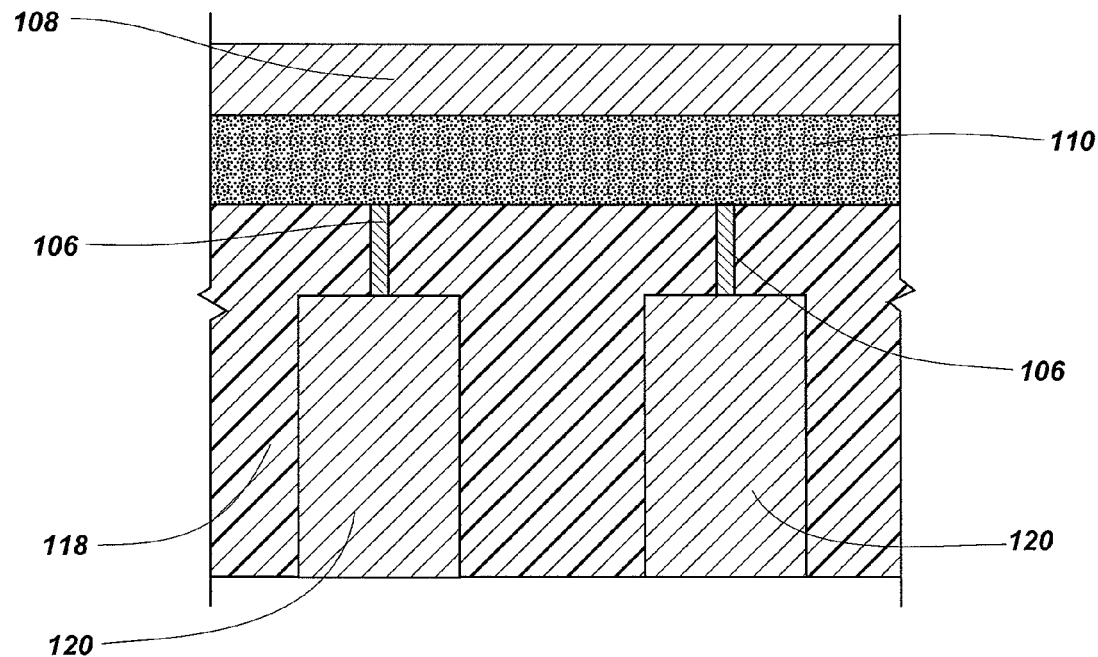
FIGS. 8A and 8B are cross-sectional side views of a workpiece and illustrate another embodiment of a method of the present invention that may be used to form a memory device like that shown in FIG. 2.

An embodiment of a method that may be used to form, for example, the memory device 200 shown in FIG. 2 is described with reference to FIGS. 8A and 8B. The memory device 200 may be formed by similar processes as the memory device 100 described above with reference to FIGS. 1, 7A, and 7B, and may include a first memory cell 102 and a second memory cell 104 as previously described herein. Referring to FIG. 8A, a volume of variable resistance material 110 may be formed on the first electrode 106 and the dielectric material 118 and may extend between the first electrode 106 of each of the memory cells 102, 104. The second electrode 108 may be formed on and in electrical communication with the volume of variable resistance material 110.

Figure 8B:
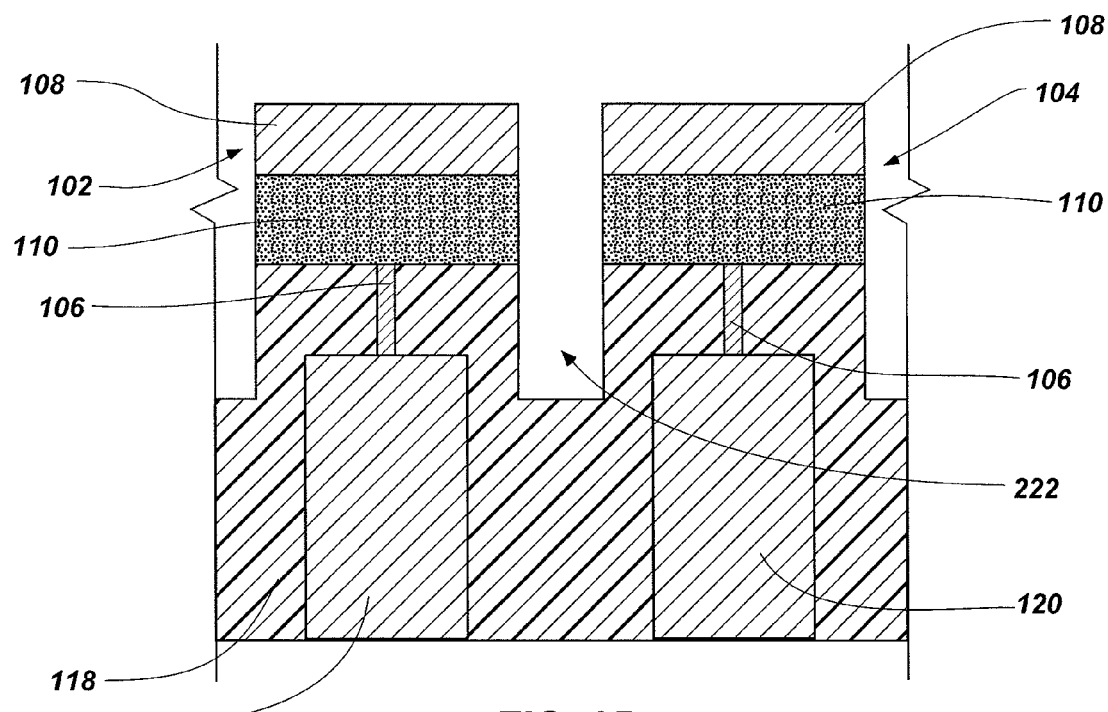

As shown in FIG. 8B and similar to the memory device 100 shown in FIG. 7A, a portion of the second electrode 108, the volume of variable resistance material 110, and the dielectric material 118 may be removed by a pattern and etch process to form the memory cells 102, 104 and the cavity 222. For example, an anisotropic reactive ion etching process may be used to etch through a portion of the second electrode 108, the volume of variable resistance material 110, and the dielectric material 118. In some embodiments, portions of the second electrode 108, the volume of variable resistance material 110, and the dielectric material 118 may be removed in a single etch process step. In some embodiments, the dielectric material 118 may be etched such that the cavity 222 extends from the distal end of the second electrode 108 of each of the memory cells 102, 104 toward the proximal end of the memory cells 102, 104 to a depth proximate the distal end of the conductive material 120.

Referring back to FIG. 2, after etching the second electrode 108, the volume of variable resistance material 110, and the dielectric material 118, a passivation material 216 may be formed on (e.g., by a CVD or ALD process) the exposed portions of the second electrode 108, the dielectric material 118, and the volume of variable resistance material 110. A non-conformal dielectric material 128 (e.g., an oxide material) may be formed on (e.g., by a CVD or PVD process) and extend between the passivation material 216 overlying the second electrode 108 of each of the memory cells 102, 104. The non-conformal dielectric material 128 may seal the cavity 222 and may, in some embodiments, form a vacuum within the cavity 222.

Figure 9A:
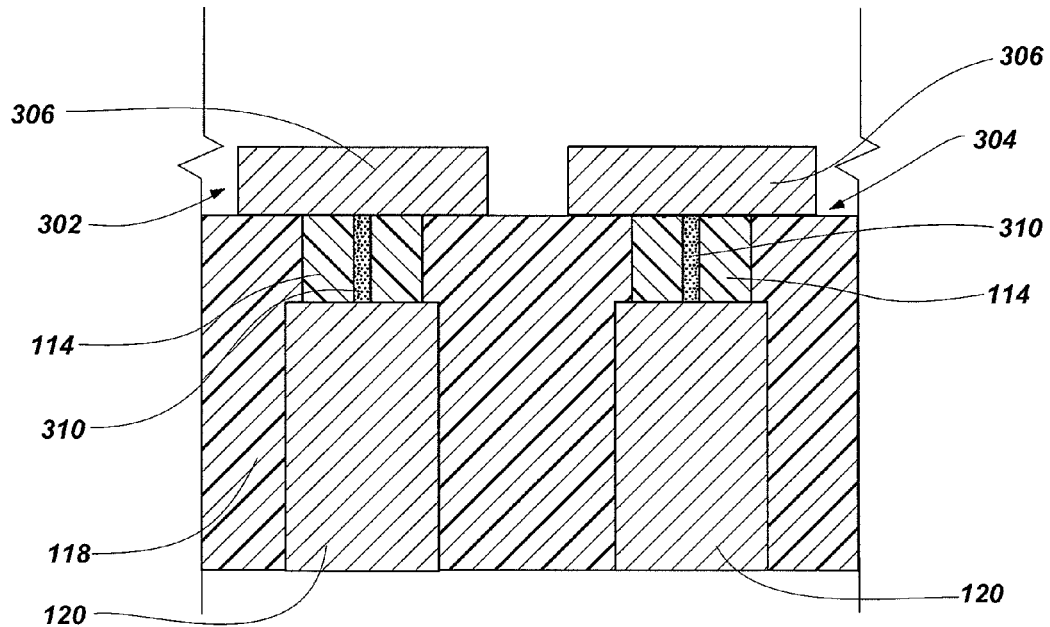
FIGS. 9A and 9B are cross-sectional side views of a workpiece and illustrate yet another embodiment of a method of the present invention that may be used to form a memory device like that shown in FIG. 3.

An embodiment of a method that may be used to form, for example, the memory device 300 shown in FIG. 3 is described with reference to FIGS. 9A and 9B. Referring to FIG. 9A, memory cells 302, 304 may be formed on and in electrical communication with a conductive material 120 formed on or in a dielectric material 118 (e.g., an oxide material). The memory cells 302, 304 may include an electrode 306, and a volume of variable resistance material 310. The volume of variable resistance material 310 may be formed on and extend from the conductive material 120 to the electrode 306. A dielectric material 114 may be formed on the conductive material 120 and may surround the electrode 306. An additional dielectric material 118 may surround the dielectric material 114 and the conductive material 120. The electrode 306 may be formed on the volume of variable resistance material 310, the dielectric material 118, and the dielectric material 114. The electrode 306 may be in electrical communication with the volume of variable resistance material 310.

As shown in FIG. 9A and similar to the memory device 100 shown in FIG. 7A, a portion of the electrode 306 may be removed (e.g., by a photolithography patterning and etching process). For example, the electrode 306 may be etched to expose the underlying dielectric material 118.

Figure 9B:
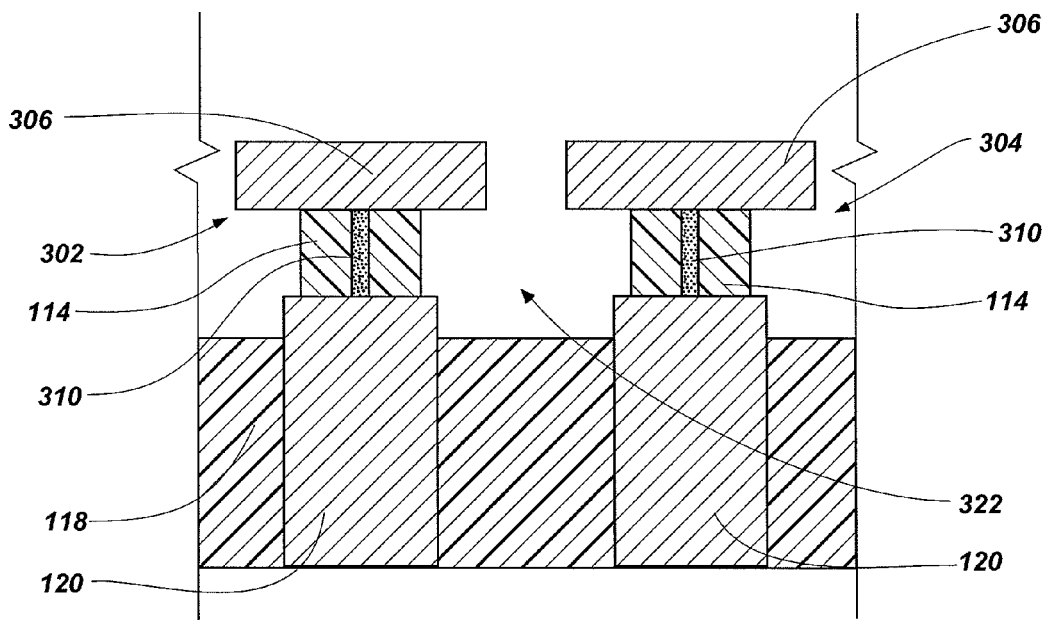

As shown in FIG. 9B, a portion of the dielectric material 118 may also be removed using a mask and etch process to form a cavity 322. By way of example and not limitation, an isotropic wet chemical etching process may be used to remove a portion of the dielectric material 118. In some embodiments, the dielectric material 118 may comprise an oxide material (e.g., $SiO_2$) and the dielectric material 114 may comprise a nitride material (e.g., $Si_3N_4$). As shown in FIG. 9B, an etchant with selectivity to the oxide material may be used to remove the oxide and to expose the dielectric material 114 and, in some embodiments, a portion of the conductive material 120. In additional embodiments, the portion of the electrode 306 may be removed and the cavity 322 may be formed using a single isotropic wet chemical etching process instead of a separate etching processes. In some embodiments, the dielectric material 118 may be etched such that the cavity 322 extends from the distal end of the electrode 306 of each of the memory cells 302, 304 to the distal end of the conductive material 120.

Referring back to FIG. 3, after etching the dielectric material 118, a non-conformal dielectric material 128 (e.g., an oxide material) may be formed on (e.g., by a CVD or PVD process) and extend between the electrode 306 of each of the memory cells 302, 304. The non-conformal dielectric material 128 may seal the cavity 322 and may, in some embodiments, form a vacuum within the cavity 322.

Figure 10A:
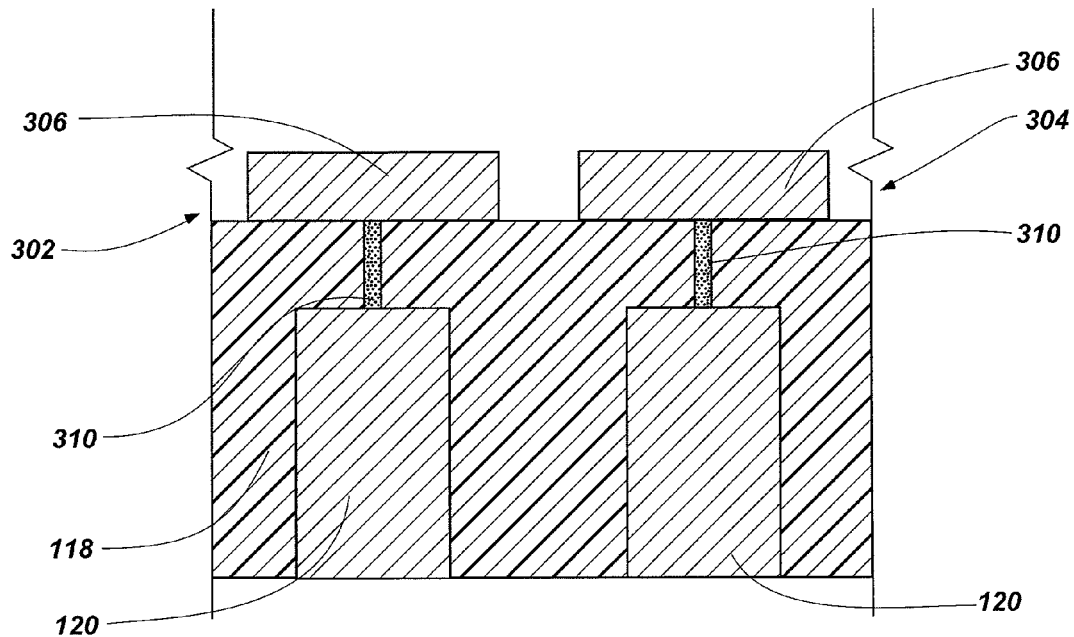
FIGS. 10A and 10B are cross-sectional side views of a workpiece and illustrate yet another embodiment of a method of the present invention that may be used to form a memory device like that shown in FIG. 4.

An embodiment of a method that may be used to form, for example, the memory device 400 shown in FIG. 4 is described with reference to FIGS. 10A and 10B. The memory device 400 may be formed by similar processes as the memory device 300 described with reference to FIGS. 3, 9A, and 9B, and may include a first memory cell 302 and a second memory cell 304 as previously described herein. As shown in FIG. 10A and similar to the memory device 100 shown in FIG. 7A, a portion of the electrode 306 may be removed (e.g., by a photolithography patterning and etching process). For example, the electrode 306 may be etched to expose the underlying dielectric material 118.

Figure 10B:
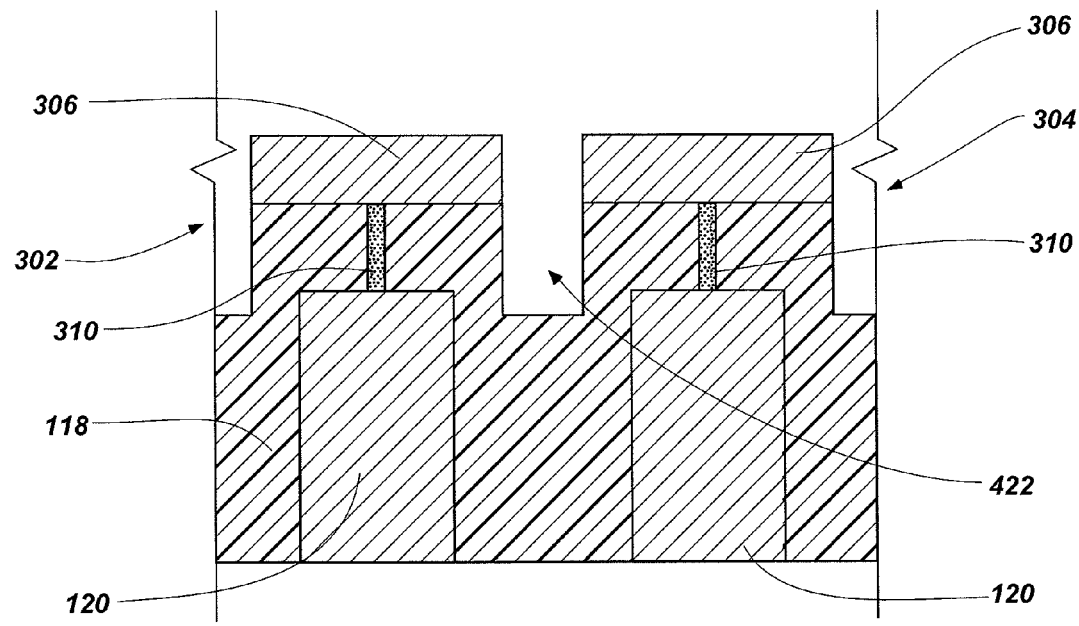

As shown in FIG. 10B, a portion of the dielectric material 118 may be removed by a pattern and etch process to form the cavity 422. For example, an anisotropic reactive ion etching process may be used to etch through a portion of the dielectric material 118. In some embodiments, portions of the electrode 306 and the dielectric material 118 may be removed in a single etch process step. In some embodiments, the dielectric material 118 may be etched such that the cavity 422 extends from the distal end of the electrode 306 of each of the memory cells 302, 304 toward the proximal end of the memory cells 302, 304 to a depth proximate the distal end of the conductive material 120.

Referring back to FIG. 4, after etching the electrode 306 and the dielectric material 118, a non-conformal dielectric material 128 (e.g., an oxide material) may be formed on (e.g., by a CVD or PVD process) and extend between the electrode 306 of each of the memory cells 302, 304. The non-conformal dielectric material 128 may seal the cavity 422 and may, in some embodiments, form a vacuum within the cavity 422.

Figure 11A:
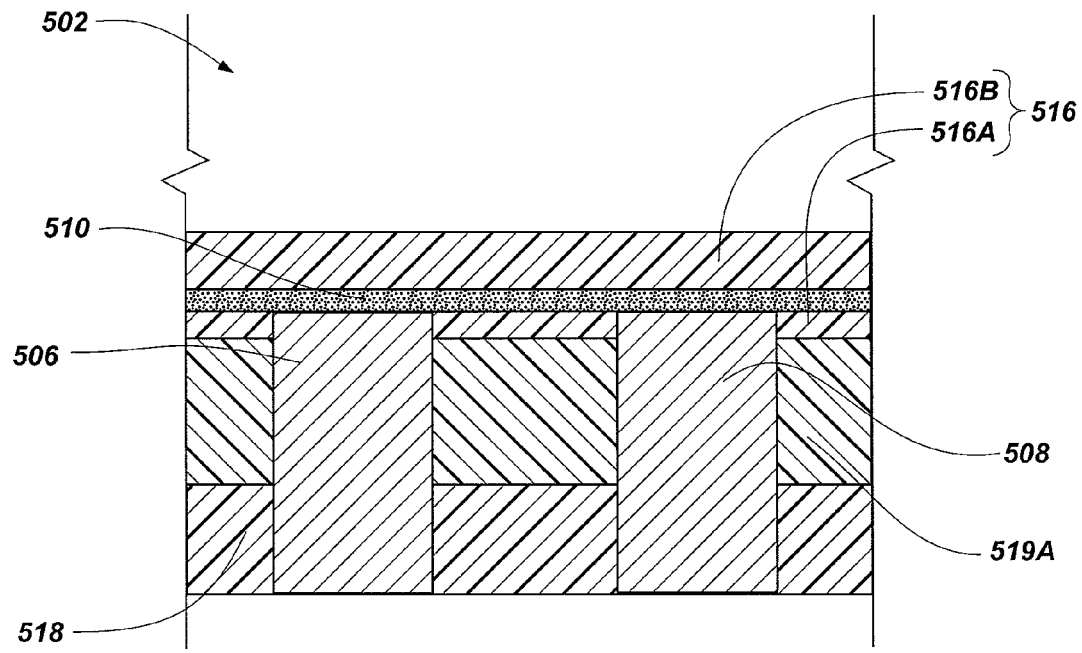
FIGS. 11A-11D are cross-sectional side views of a workpiece and illustrate yet another embodiment of a method of the present invention that may be used to form a memory device like that shown in FIGS. 5A and 5B.

An embodiment of a method that may be used to form the memory device 500 shown in FIGS. 5A and 5B is described with reference to FIGS. 11A and 11B. Referring to FIG. 11A, each memory cell (e.g., memory cell 502) of the memory device 500 may each include a first electrode 506 and a second electrode 508 formed in a dielectric material 518 (e.g., a nitride material). A second dielectric material 519A (e.g., an oxide material) may be formed around the electrodes 506, 508. A third dielectric material 516A (e.g., a nitride material) may be formed around the electrodes 506, 508 and may be substantially flush with the distal ends of the electrodes 506, 508. In some embodiments, a portion of the third dielectric material 516A may be removed after being formed around the electrodes 506, 508 using, for example, a chemical-mechanical polishing (CMP) process, a selective etching process, or a lift-off process to expose a distal portion of the electrodes 506, 508. The volume of variable resistance material 510 may be formed on the dielectric material 516A and may extend from the first electrode 506 to the second electrode 508. A fourth dielectric material 516B may be formed on the volume of variable resistance material 510. In some embodiments, the third and fourth dielectric materials 516A, 516B may comprise a similar material (e.g., a nitride material) and may form the dielectric material 516 partially surrounding the volume of variable resistance material 510.

Figure 11B:
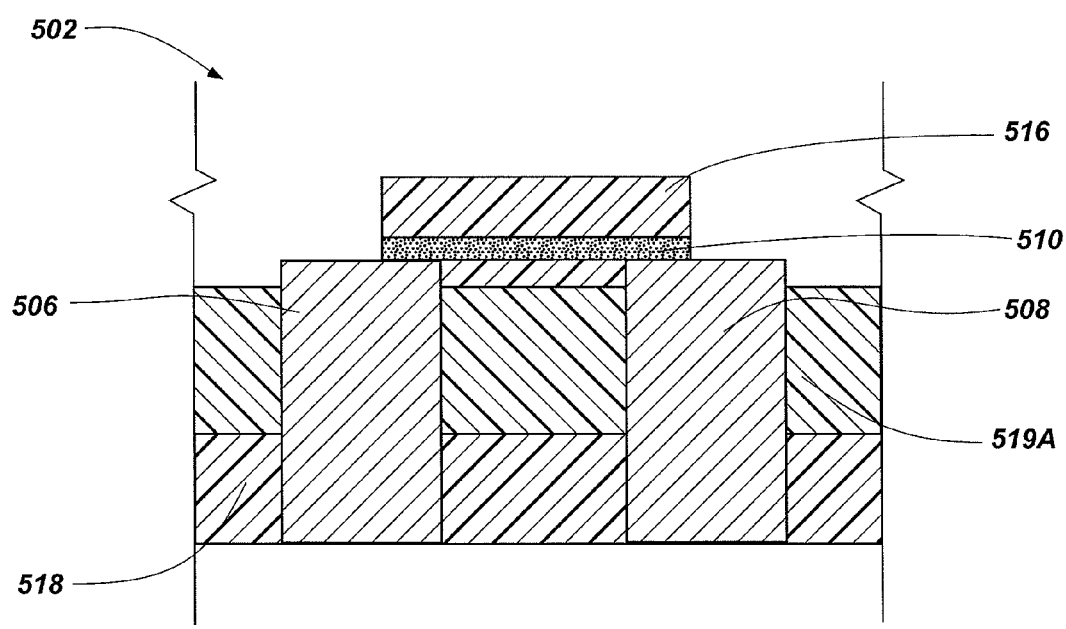

Referring now to FIG. 11B, portions of the dielectric material 516 and the volume of variable resistance material 510 may be removed (e.g., by a photolithography patterning and etching process). For example, the dielectric material 516 and the volume of variable resistance material 510 may be etched to expose a portion of the electrodes 506, 508 and a portion of the underlying second dielectric material 519A. The dielectric material 516 and the volume of variable resistance material 510 may be removed to form a line stripe structure (i.e., as shown in FIG. 5B, the dielectric material 516 and the volume of variable resistance material 510 may extend between the electrodes 506, 508).

Figure 11C:
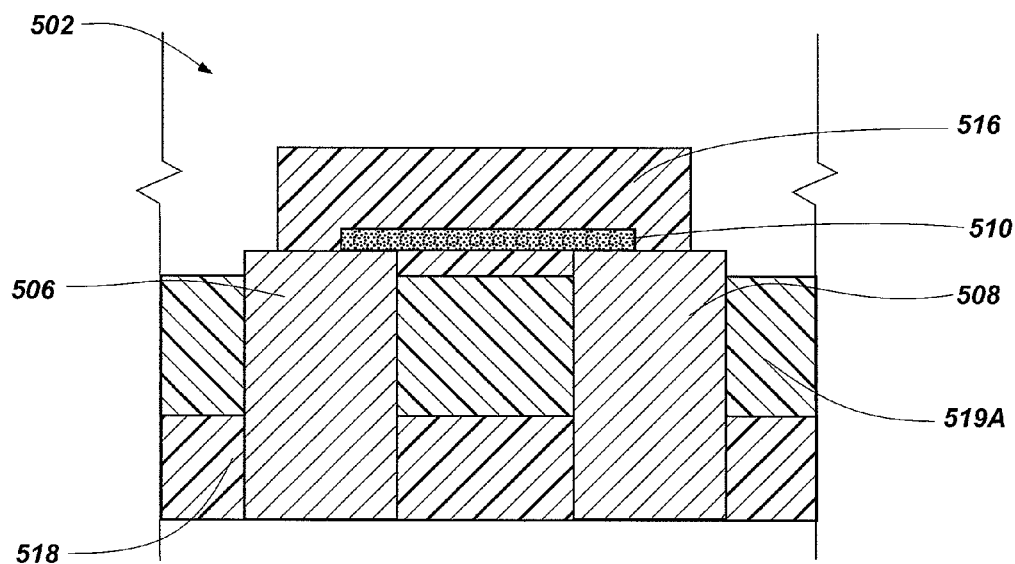

An additional dielectric material (e.g., a nitride material substantially similar to the dielectric material 516) may be formed on the dielectric material 516, the electrodes 506, 508, the volume of variable resistance material 510, and the second dielectric material 519A to cover the exposed ends of the volume of variable resistance material 510 formed by the previous etching process. A portion of the dielectric material 516 may be removed (e.g., by a spacer etch process) to form a line stripe structure, shown in FIG. 11C, which includes the volume of variable resistance material 510 surrounded by the dielectric material 516.

Figure 11D:
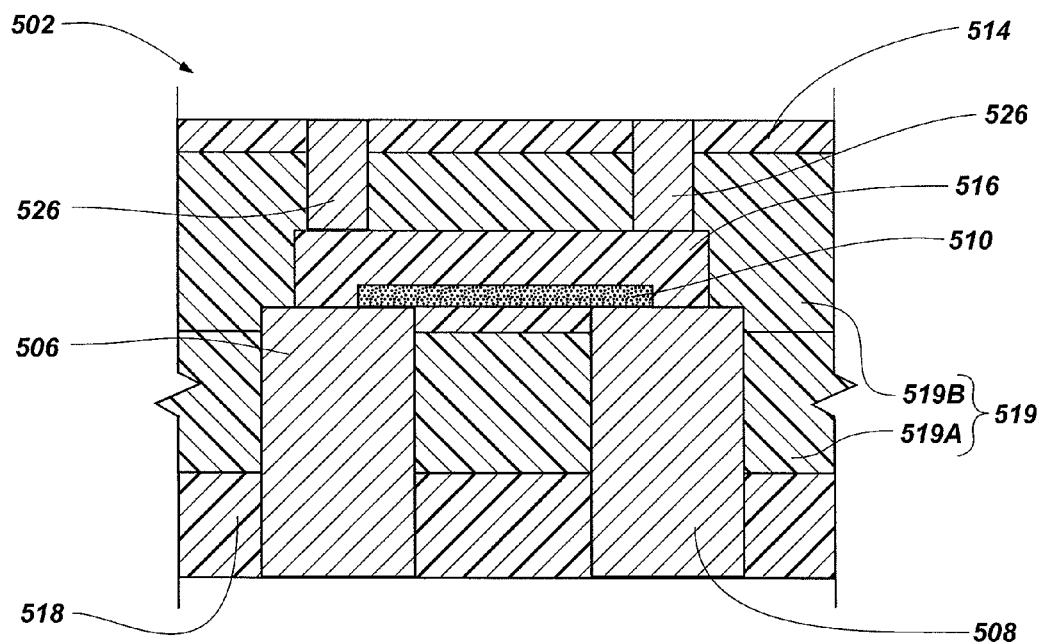

As shown in FIG. 11D, additional dielectric material 519B (e.g., an oxide material substantially similar to the second dielectric material 519A) may be formed on the dielectric material 516, the dielectric material 519A, and the electrodes 506, 508. In some embodiments, the second dielectric material 519A, 519B may comprise a similar material (e.g., an oxide material) and may form the dielectric material 519. After forming the dielectric material 519, a portion of the dielectric material 519 may be removed, for example, the dielectric material 516 planarized using a chemical-mechanical polishing (CMP). The dielectric material 514 (e.g., a nitride material) may be formed on the dielectric material 516. Conductive material 526 may be formed on dielectric material 516 of the memory cell 502 and may extend through the dielectric material 514 and the dielectric material 519. For example, a portion of the dielectric materials 514, 519 may be removed (e.g., by a patterning and etching process) and the conductive material 526 may be formed to extend from the dielectric material 516 to a distal end of the memory cell 502 (e.g., the distal side of the dielectric material 514).

Referring back to FIGS. 5A and 5B, a portion of the dielectric material 519 may be removed by, for example, a pattern and etch process to form the cavity 522. In some embodiments the entire dielectric material 519 may be removed. For example, an isotropic wet chemical etching process may be used to remove a portion of the dielectric material 519 by forming a small opening in the dielectric material 514 to expose the dielectric material 519 to the isotropic wet chemical etching process. After the dielectric material 519 is removed, the dielectric material 514 formed on the conductive material 526 may be supported by the conductive material 526. The cavity 522 formed by the removal of the dielectric material 519 may form a vacuum and may extend between the memory cells 502, 504 and in some embodiments, between the electrodes 506, 508 of each of the memory cells 502, 504.

Referring again to FIG. 6, in some embodiments, memory cells similar to the memory cells 102, 104, 302, 304, and 502 shown in FIGS. 1, 2, 3, 4, and 5A, respectively, may form a memory device 600 including a tie-down 630. The memory cells 102, 103, 104, and 105 may be formed in a manner similar to the above-described methods. The memory cells 102, 103, 104, and 105 may also include an electrical contact 621 formed on each of the memory cells 102, 103, 104, and 105. For example, the electrical contact 621 may be formed on and in electrical communication with the second electrode 108 of each of the memory cells 102, 103, 104, and 105. An additional dielectric material 628 may be formed on the passivation material 216 overlying the second electrode 108 of each of the memory cells 102, 103, 104, and 105. In some embodiments, the additional dielectric material 628 may include a non-conformal dielectric material. The non-conformal portion of the dielectric material 628 may fill in the area surrounding the tie-down 630 while not filling in the cavities 222 disposed between the memory cells 102, 103, 104, and 105. In some embodiments, the dielectric material 628 may include a non-conformal portion and a dielectric material. The non-conformal portion may be formed proximate to the memory cells 102, 103, 104, and 105 to seal a distal portion of the cavities 222 while not filling in the cavities 222. The dielectric material may be formed on the non-conformal portion of the additional dielectric material 628 and on the passivation material 216 to fill in the area surrounding the tie-down 630 and to form the dielectric material 628.

Figure 12:
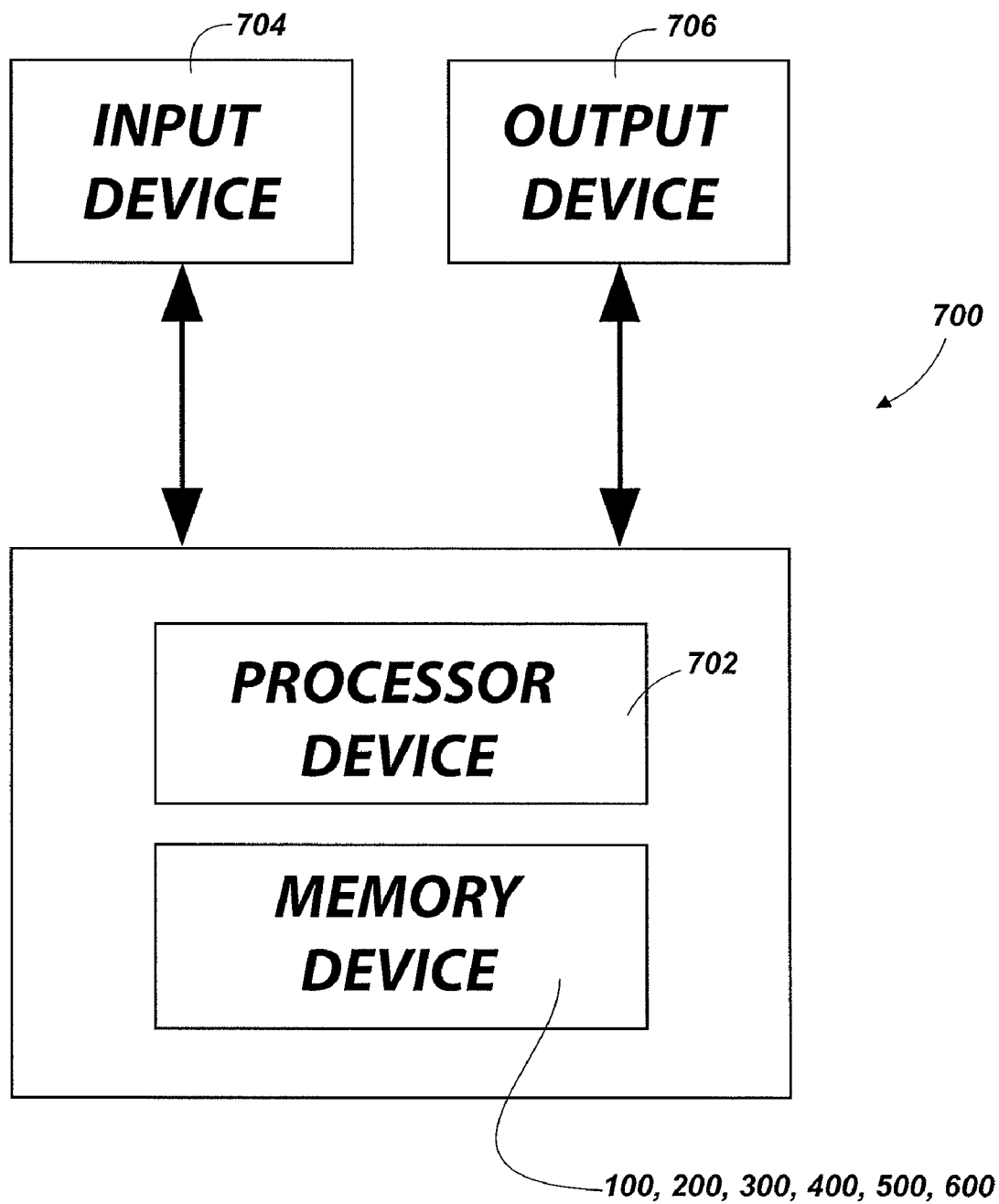
FIG. 12 is a schematic block diagram illustrating one embodiment of an electronic system of the present invention that includes a memory device like the memory devices shown in FIGS. 1 through 6.

Memory devices like that shown in FIGS. 1 through 6 may be used in embodiments of electronic systems of the present invention. For example, FIG. 12 is a block diagram of an illustrative electronic system 700 according to the present invention. The electronic system 700 may comprise, for example, a computer or computer hardware component, a server or other networking hardware component, a cellular telephone, a digital camera, a personal digital assistant (PDA), portable media (e.g., music) player, etc. The electronic system 700 includes at least one memory device of the present invention, such as one of the embodiments of the memory device 100, 200, 300, 400, 500, and 600 shown in FIGS. 1 through 6. The electronic system 700 further may include at least one electronic signal processor device 702 (often referred to as a "microprocessor"). The electronic system 700 may, optionally, further include one or more input devices 704 for inputting information into the electronic system 700 by a user, such as, for example, a mouse or other pointing device, a keyboard, a touchpad, a button, or a control panel. The electronic system 700 may further include one or more output devices 706 for outputting information (e.g., visual or audio output) to a user such as, for example, a monitor, display, printer, speaker, etc. The one or more input devices 704 and output devices 706 may communicate electrically with at least one of the memory device 100, 200, 300, 400, 500, and 600 and the electronic signal processor device 702.

In view of the above description, some embodiments of the present invention include memory devices having memory cells including a cavity extending between the memory cells. In some embodiments, the memory devices may include a volume of variable resistance material disposed between two electrodes. A portion of the memory cells and a passivation material formed over the memory cells may partially form the cavity extending between two memory cells. In additional embodiments, the present invention comprises electronic systems that include one or more such memory devices. The one or more such memory devices may be in electrical communication with an electronic signal processor. In other embodiments, the present invention includes methods of forming such memory devices. Such methods may include removing a selected amount of dielectric material disposed between the memory cells in a memory device to form a cavity.

Embodiments of the present invention may be particularly useful in forming memory cell structures including enhanced isolation of the memory cells for use in a memory device. Particularly, providing enhanced isolation of the memory cells by a vacuum cavity formed between the memory cells may allow for enhanced thermal isolation of the memory cells. Memory devices, in particular memory devices including a phase change memory cell, may undergo high temperature changes to alter the state of the memory cell. The voltage applied to the phase change material may bleed from one memory cell to adjacent memory cells and the heat generated in one memory cell may also bleed to the adjacent memory cells. Such thermal and electrical crosstalk between cells my cause unintentional changes in the state of the memory cells. Additionally, forces caused by the thermal expansion and contraction of the memory cell structures during high temperatures changes may introduce stresses into the structures. Providing a vacuum cavity between the memory cells may allow for reduced thermal and electrical crosstalk between the cells and reduce unintentional state changes in the memory cells and undesirable data loss. Moreover, providing a cavity between the memory cells may allow the cell to freely expand and relax, thereby, reducing the stress caused by thermal expansion and contraction and improving the structural integrity of the cells.

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed, and legal equivalents. In addition, features from one embodiment may be combined with features of another embodiment while still being encompassed within the scope of the invention as contemplated by the inventors.

What is claimed is:

1. A memory device comprising:
at least a first memory cell and a second memory cell on a substrate, each memory cell comprising:
a first electrode;
a second electrode; and
a volume of variable resistance material between the first electrode and the second electrode;
a cavity disposed between the at least a first memory cell and the second memory cell;
a dielectric material extending over and between the at least a first memory cell and the second memory cell on a side thereof opposite the substrate, the dielectric material at least partially defining a boundary of the cavity; and
a passivation material over at least a portion of the volume of variable resistance material of each of the at least a first memory cell and the second memory cell, the passivation material partially defining the boundary of the cavity, wherein the cavity extends from a portion of the passivation material over the at least a portion of the volume of variable resistance material of the at least a first memory cell to a portion of the passivation material over the at least a portion of the volume of variable resistance material of the second memory cell.

2. The memory device of claim 1, wherein the dielectric material comprises a non-conformal dielectric material.

3. The memory device of claim 2, wherein the non-conformal dielectric material is disposed on a portion of the passivation material.

4. The memory device of claim 2, wherein a portion of the at least a first memory cell, a portion of the second memory cell, and a portion of the non-conformal dielectric material at least partially enclose the cavity.

5. The memory device of claim 4, wherein the enclosed cavity comprises a vacuum.

6. The memory device of claim 1, wherein the first electrode and the second electrode each comprise a discrete volume of conductive material.

7. The memory device of claim 1, wherein the volume of variable resistance material comprises a phase change material.

8. The memory device of claim 1, further comprising a second dielectric material surrounding a portion of the volume of variable resistance material of each of the at least a first memory cell and the second memory cell.

9. A memory device comprising:
at least a first memory cell and a second memory cell on a substrate, each memory cell comprising:
a first electrode;
a second electrode; and
a volume of variable resistance material between the first electrode and the second electrode;
a cavity disposed between the at least a first memory cell and the second memory cell; and
a dielectric material extending over and between the at least a first memory cell and the second memory cell on a side thereof opposite the substrate, the dielectric material at least partially defining a boundary of the cavity, wherein the first electrode and the second electrode of each of the at least a first memory cell and the second memory cell are disposed on a side of the volume of variable resistance material proximate the substrate.

10. The memory device of claim 9, wherein each of the at least a first memory cell and the second memory cell comprises:

at least two discrete conductive material structures disposed on a side of the volume of variable resistance material opposite the substrate; and
a second dielectric material disposed on and extending between the at least two discrete conductive material structures.

11. A memory device comprising:
a vacuum cavity disposed between a volume of variable resistance material of a first memory cell and a volume of variable resistance material of a second memory cell;
a non-conformal dielectric material extending over and between an end of each of the first memory cell and the second memory cell, the vacuum cavity at least partially bounded by the non-conformal dielectric material; and
a dielectric material surrounding the volume of variable resistance material of the first memory cell and the volume of variable resistance material of the second memory cell, wherein at least a portion of the vacuum cavity extends from the dielectric material surrounding the volume of variable resistance material of the first memory cell to the dielectric material surrounding the volume of variable resistance material of the second memory cell.

12. The memory device of claim 11, wherein a first portion of the vacuum cavity is disposed directly between the volume of variable resistance material of the first memory cell and the volume of variable resistance material of the second memory cell, and a second portion of the vacuum cavity is disposed directly between an electrode of the first memory cell and an electrode of the second memory cell.

13. A memory device comprising:
a substrate;
a plurality of memory cells, at least two adjacent memory cells of the plurality each comprising:
a first electrode disposed over the substrate;
a second electrode; and
a volume of variable resistance material disposed between the first electrode and the second electrode;
a non-conformal dielectric material extending over and between a distal end of each of the at least two adjacent memory cells;
a vacuum cavity disposed between the at least two adjacent memory cells and between the substrate and the non-conformal dielectric material; and
a dielectric material surrounding the first electrode of each of the at least two adjacent memory cells of the plurality of memory cells, wherein the vacuum cavity extends from the dielectric material surrounding the first electrode of one memory cell of the at least two adjacent memory cells to the dielectric material surrounding the first electrode of another memory cell of the at least two adjacent memory cells of the plurality of memory cells.

14. The memory device of claim 13, further comprising another dielectric material surrounding the volume of variable resistance material of each of the at least two adjacent memory cells of the plurality of memory cells.

15. The memory device of claim 14, wherein the vacuum cavity extends from the another dielectric material surrounding the volume of variable resistance material of one memory cell of the at least two adjacent memory cells of the plurality of memory cells to the another dielectric material surrounding the volume of variable resistance material of another memory cell of the at least two adjacent memory cells of the plurality of memory cells.

16. An electronic system comprising:
at least one electronic signal processor;
at least one memory device configured to communicate electrically with the at least one electronic signal processor, the at least one memory device comprising:
a plurality of memory cells, each memory cell of the plurality comprising:
a first electrode;
a second electrode; and
a volume of variable resistance material disposed between the first electrode and the second electrode; and
a vacuum cavity disposed between the volume of variable resistance material of a first memory cell of the plurality of memory cells and the volume of variable resistance material of a second memory cell of the plurality of memory cells;
a dielectric material surrounding a portion of the volume of variable resistance material of each memory cell of the plurality of memory cells, wherein the vacuum cavity extends from the dielectric material surrounding the portion of the volume of variable resistance material of a first memory cell of the plurality of memory cells to the dielectric material surrounding the portion of the volume of variable resistance material of a second memory cell of the plurality of memory cells; and
at least one of an input device and an output device configured to communicate electrically with the at least one electronic signal processor.

* * * * *